(12) United States Patent
Ogihara et al.

(10) Patent No.: US 8,409,366 B2
(45) Date of Patent: Apr. 2, 2013

(54) SEPARATION METHOD OF NITRIDE SEMICONDUCTOR LAYER, SEMICONDUCTOR DEVICE, MANUFACTURING METHOD THEREOF, SEMICONDUCTOR WAFER, AND MANUFACTURING METHOD THEREOF

(75) Inventors: Mitsuhiko Ogihara, Gunma (JP); Tomohiko Sagimori, Gunma (JP); Masaaki Sakuta, Tokyo (JP); Akihiro Hashimoto, Fukui (JP)

(73) Assignee: Oki Data Corporation, Tokyo (JP)

( * ) Notice: Subject to any disclaimer, the term of this patent is extended or adjusted under 35 U.S.C. 154(b) by 214 days.

(21) Appl. No.: 12/801,716

(22) Filed: Jun. 22, 2010

(65) Prior Publication Data

US 2010/0320445 A1  Dec. 23, 2010

(30) Foreign Application Priority Data

Jun. 23, 2009 (JP) ................. 2009-148455
Jun. 23, 2009 (JP) ................. 2009-148666

(51) Int. Cl.
*H01L 29/16* (2006.01)
*H01L 33/00* (2010.01)
*H01L 21/02* (2006.01)
*H01L 29/20* (2006.01)

(52) U.S. Cl. .. 148/33.4; 257/79; 257/613; 257/E33.002; 257/E21.041; 257/E21.568; 438/46; 438/458; 438/492; 438/496; 117/106; 148/33.6

(58) Field of Classification Search ............ 438/46, 438/99, 105, 455, 458, 459, 791, 932, FOR. 127, 438/22, 33, 758, 761, 763, 800, FOR. 385, 438/FOR. 416; 257/E21.536, E21.211, E21.568, 257/E21.567, E21.088, E21.122, 76, 77, 257/79, 613, E39.006, E33.002, E21.041; 977/734

See application file for complete search history.

(56) References Cited

U.S. PATENT DOCUMENTS 6,562,648 B1    5/2003  Wong et al.
7,781,061 B2 *  8/2010  Garcia et al. ............. 428/402
(Continued)

FOREIGN PATENT DOCUMENTS

JP   09-018053 A   1/1997
JP   11-243253     9/1999
(Continued)

OTHER PUBLICATIONS

Riedl et al.: "Precise in situ thickness analysis of epitaxial grapheme layers on SiC(0001) using low-energy electron diffraction and angle resolved ultraviolet photoelectron spectroscopy"; American Institute of Physics, Melville, NY, US, Applied Physics Letters, Jul. 23, 2008, vol. 93, Issue No. 3, pp. 33106-1 through 33106-3.

*Primary Examiner* — Kevin Parendo
*Assistant Examiner* — Quovaunda V Jefferson
(74) *Attorney, Agent, or Firm* — Rabin & Berdo, P.C.

(57) ABSTRACT

In a separation method of a nitride semiconductor layer, a graphene layer in the form of a single layer or two or more layers is formed on a surface of a first substrate. A nitride semiconductor layer is formed on the graphene layer so that the nitride semiconductor layer is bonded to the graphene layer with a bonding force due to regularity of potential at atomic level at an interface therebetween without utilizing covalent bonding. The nitride semiconductor layer is separated from the first substrate with a force which is greater than the bonding force between the nitride semiconductor layer and the graphene layer, or greater than a bonding force between respective layers of the graphene layer.

14 Claims, 22 Drawing Sheets

U.S. PATENT DOCUMENTS

| | | | |
|---|---|---|---|
| 7,927,978 B2 * | 4/2011 | Pfeiffer | 438/478 |
| 2003/0064535 A1 | 4/2003 | Kub et al. | |
| 2006/0166390 A1 * | 7/2006 | Letertre et al. | 438/34 |

FOREIGN PATENT DOCUMENTS

| | | |
|---|---|---|
| JP | 2002-76523 | 3/2002 |
| JP | 2003-198038 | 7/2003 |
| JP | 2003-528466 | 9/2003 |
| JP | 2006-135311 A | 5/2006 |
| JP | 2008-263126 | 10/2008 |
| JP | 2008-294110 | 12/2008 |
| JP | 2009-81285 | 4/2009 |
| WO | WO 01/71797 A1 | 9/2001 |
| WO | WO 2006/132386 A1 | 12/2006 |

* cited by examiner

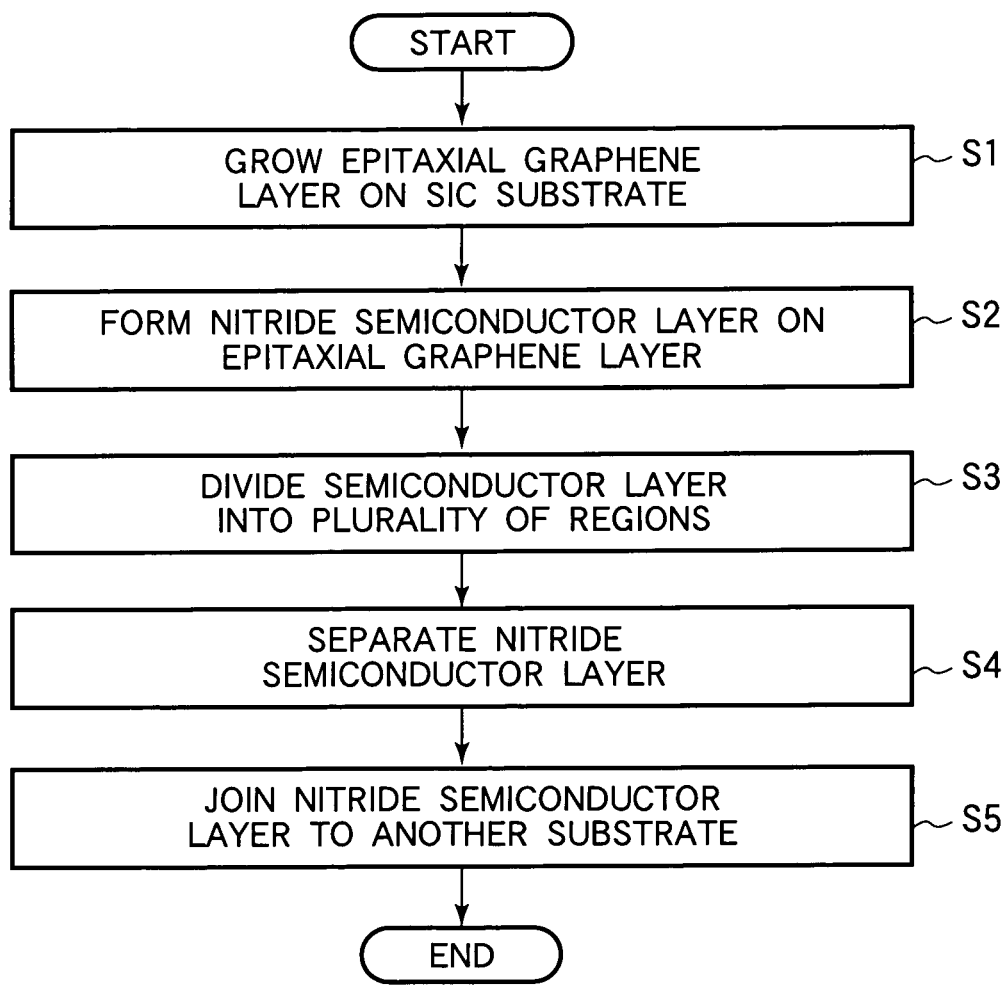

- 506 p-GaN(Mg)
- 505 p-AlGaN(Mg)
- 504 InGaN/GaN/····InGaN/GaN/InGaN
- 503 n-AlGaN(Si)
- 502 n-GaN(Si)

- 506 p-GaN(Mg)
- 505 p-AlGaN(Mg)
- 504 InGaN/GaN/····InGaN/GaN/InGaN
- 503 n-AlGaN(Si)
- 502 n-GaN(Si)
- 501 AlN

- 605 p-GaN(Mg)
- 604 p-AlGaN(Mg)
- 603 InGaN
- 602 n-GaN(Si)
- 601 AlN

- 704 p-$Al_xGa_{1-x}N$
- 703 i-$Al_yGa_{1-y}N$
- 702 n-$Al_xGa_{1-x}N$
- 701 AlN

114D

- 805 $n^+$-GaN
- 804 p-GaN
- 803 $n^-$-AlGaN
- 802 $n^+$-AlGaN
- 801 AlN

114E 114F
904 n-GaN
903 UNDOPE AlGaN
902 UNDOPE GaN 114G
1003 n-GaN
1002 UNDOPE GaN

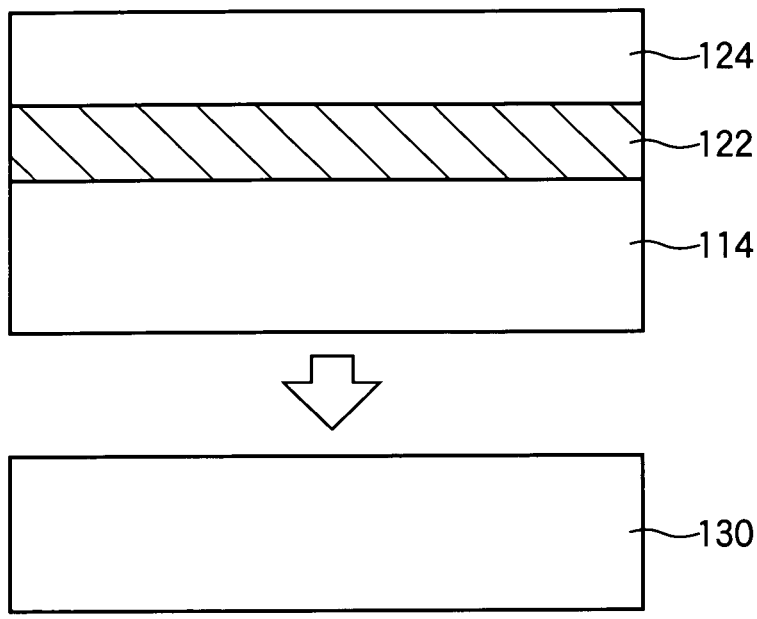
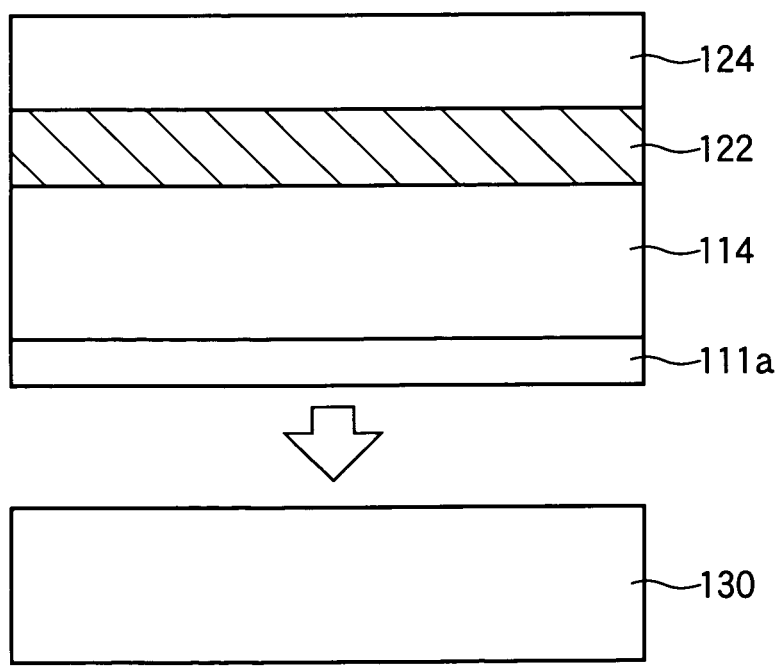

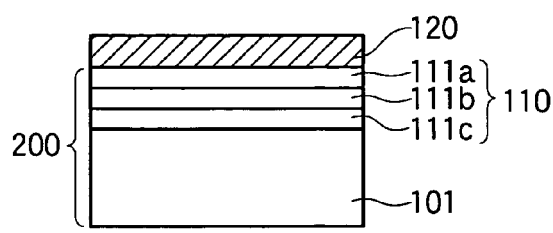
FIG.20A
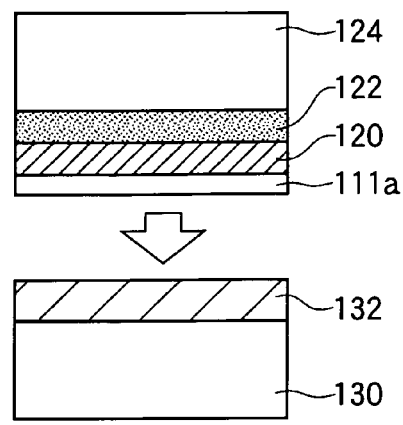
FIG.20D
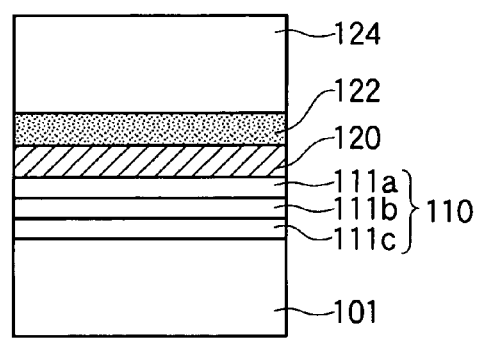
FIG.20B
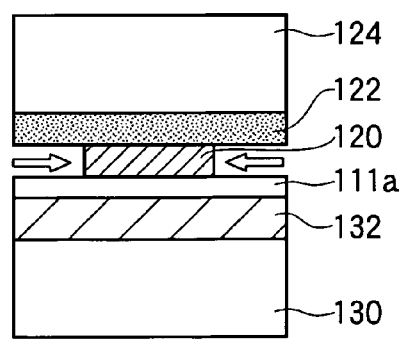
FIG.20E
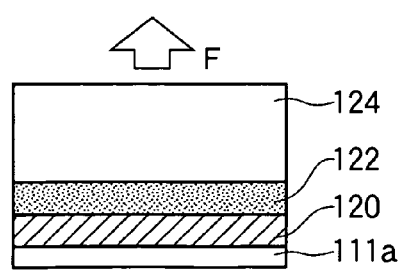
FIG.20C
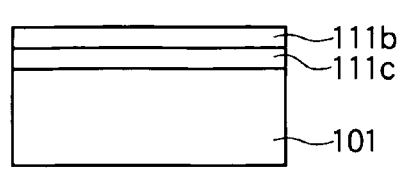
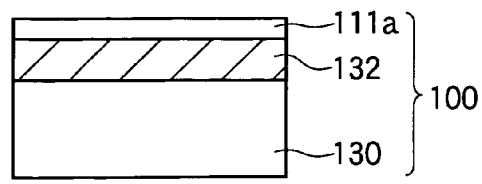

SEPARATION METHOD OF NITRIDE SEMICONDUCTOR LAYER, SEMICONDUCTOR DEVICE, MANUFACTURING METHOD THEREOF, SEMICONDUCTOR WAFER, AND MANUFACTURING METHOD THEREOF

BACKGROUND OF THE INVENTION

The present invention relates to a separation method of nitride semiconductor layer, a semiconductor device and a manufacturing method thereof.

The present invention also relates to a semiconductor wafer, and a manufacturing method thereof.

As an example of a conventional manufacturing method of a semiconductor device, Patent Document No. 1 discloses a manufacturing method of an LED (Light Emitting Diode), in which a buffer layer, an n-type nitride semiconductor layer, an active layer, a p-type nitride semiconductor layer, an n-type contact layer are grown on a sapphire substrate in this order so as to form a semiconductor wafer. Further, these layers are etched so as to partially remove the n-type contract layer, the p-type nitride semiconductor layer and the active layer, and to expose the n-type nitride semiconductor layer. Then, an Al (aluminum) electrode is formed on the exposed surface of the n-type nitride semiconductor layer and on the surface of the n-type contact layer using a deposition method. Thereafter, a heat treatment is performed to ensure a sufficient contact.

The growth of the above described layers (i.e., semiconductor epitaxial layers) is carried out using an MOCVD (Metal Organic Chemical Vapor Deposition) method. Using such a method, a nitride LED with high light emission efficiency is manufactured.

Recently, there is a need for integration of LEDs formed of different materials or integration of semiconductor devices with different functions. For this reason, it is preferred to separate the epitaxial semiconductor layers from the sapphire substrate (referred to as a first substrate), and to fix the semiconductor epitaxial layers to another substrate (referred to a second substrate).

Conventionally, there is proposed a laser lift-off method, in which a laser beam is irradiated onto a backside of the sapphire substrate to thereby decompose the nitride semiconductor layer in the vicinity of the sapphire substrate, by which the semiconductor epitaxial layers can be separated from the sapphire substrate. To be more specific, the laser beam irradiation onto the backside of the sapphire substrate causes GaN (gallium nitride) to be decomposed into Ga (gallium) and N (nitrogen) at an interface between the sapphire substrate and the nitride semiconductor layer. Since a melting point of Ga is at a room temperature, the semiconductor epitaxial layers can be separated from the sapphire substrate.

In this method, however, a separation surface of the semiconductor epitaxial layers separated from the sapphire substrate does not have a sufficient flatness (i.e., on the order of nanometers).

In order to join the nitride semiconductor epitaxial layers to a second substrate different from the first substrate (the sapphire substrate) using intermolecular force, it is preferred that the separation surface of the semiconductor epitaxial layers has a flatness on the order of nanometers. If the separation surface of the semiconductor epitaxial layers (separated from the first substrate) does not have a flatness on the order of nanometers, a sufficient intermolecular force (i.e., a joint force) is not obtained.

Therefore, in the method disclosed in Patent Document No. 1, it is necessary to perform a surface treatment to enhance the flatness of the separation surface of the semiconductor epitaxial layers, after the above described separation process using the lift-off method.

Meanwhile, a semiconductor crystal growth technology has been developed mainly for growing semiconductor layers on a lattice-matched substrate. Recently, a non-equilibrium epitaxial growth technology such as MBE (Molecular Beam Epitaxy) or MOCVD (Metal Organic Chemical Vapor Deposition) has been developed for growing semiconductor layers on a lattice mismatched substrate. In this regard, for example, Patent Document No. 2 discloses a manufacturing method of a nitride semiconductor device, in which a stack of an amorphous nitride layer and a GaN buffer layer is formed on a surface of a sapphire substrate, and then nitride semiconductor layers are grown on the stack.

However, in the method disclosed in Patent Document No. 2, there is a lattice mismatch of approximately 10% between the nitride semiconductor layers and the sapphire substrate. When crystal growth is performed while maintaining a covalent bonding with the substrate, crystal defects may be formed due to such a lattice mismatch at an interface. Therefore, there is a limit in enhancement of crystal characteristics of the grown nitride semiconductor layers.

In this regard, a high quality and large diameter nitride semiconductor wafer is still in the process of development. Therefore, there has been a demand for a crystal growth technology of high quality and large diameter single crystal nitride semiconductor on a lattice mismatched substrate.

Patent Document No. 1: Japanese Laid-Open Patent Publication No. 2006-135311

Patent Document No. 2: Japanese Laid-Open Patent Publication No. H09-18053

SUMMARY OF THE INVENTION

The present invention is intended to provide a separation method of a nitride semiconductor layer, a semiconductor device and a manufacturing method thereof capable of facilitating separation of the nitride semiconductor layer from a substrate.

Further, the present invention is intended to provide a semiconductor wafer and a manufacturing method thereof capable of producing high quality single crystal nitride semiconductor substantially free from crystal defects by means of crystal growth on a lattice mismatched substrate.

The present invention provides a separation method of a nitride semiconductor layer. The separation method includes the steps of: growing a graphene layer in the form of a single layer or two or more layers on a surface of a first substrate, forming a nitride semiconductor layer on the graphene layer so that the nitride semiconductor layer is bonded to the graphene layer with a bonding force due to regularity of potential at atomic level at an interface therebetween without utilizing covalent bonding, and separating the nitride semiconductor layer from the first substrate with a force which is greater than the bonding force between the nitride semiconductor layer and the graphene layer, or greater than a bonding force between layers of the graphene layer.

The present invention also provides a manufacturing method of a nitride semiconductor device. The manufacturing method includes the above described separation method of the nitride semiconductor layer. The manufacturing method further includes the step of joining the nitride semiconductor layer to a surface of a second substrate.

The present invention also relates to a manufacturing method of a semiconductor device, the manufacturing method comprising the steps of: growing a graphene layer in the form of a single layer or two or more layers on a surface of a first substrate, forming a nitride semiconductor layer on the graphene layer so that the nitride semiconductor layer is bonded to the graphene layer with a bonding force due to regularity of potential at atomic level at an interface therebetween without utilizing covalent bonding, joining a surface of the nitride semiconductor layer to a surface of a second substrate, and separating the nitride semiconductor layer from the first substrate with a force which is greater than the bonding force between the nitride semiconductor layer and the graphene layer.

The present invention also provides a semiconductor device including a nitride semiconductor layer formed by growing the nitride semiconductor layer on a graphene layer in the form of a single layer or two or more layers on a first substrate so that the nitride semiconductor layer is bonded to the graphene layer with a bonding force due to regularity of potential at atomic level at an interface therebetween without utilizing covalent bonding, separating the nitride semiconductor layer from the first substrate with a force which is greater than the bonding force between the nitride semiconductor layer and the graphene layer, or greater than a bonding force between layers of the graphene layer, and joining the nitride semiconductor layer to a surface of the second substrate.

The present invention also provides a manufacturing method of a semiconductor wafer in which a single crystal semiconductor layer is grown on a surface of a semiconductor substrate. The manufacturing method includes the steps of: providing a graphene layer on the surface of the semiconductor substrate, forming a first layer of the single crystal semiconductor layer on the graphene layer in such a manner that one constituent element of a crystal of the single crystal semiconductor layer is adsorbed to a center portion of a honeycomb structure of carbon atoms of the graphene layer, and the other constituent element of the crystal is bonded to the one constituent element, and growing the single crystal semiconductor layer on a surface of the first layer.

The present invention also provides a semiconductor wafer in which a single crystal semiconductor layer is grown on a surface of a substrate. The semiconductor wafer includes the substrate, a graphene layer provided on a surface of the substrate, and the single crystal semiconductor layer grown on a surface of the graphene layer. The single crystal semiconductor layer is formed in such a manner that one constituent element of a crystal of the single crystal semiconductor layer is adsorbed to a center portion of a honeycomb structure of carbon atoms of the graphene layer, and the other constituent element of the crystal is bonded to the one constituent element.

Further scope of applicability of the present invention will become apparent from the detailed description given hereinafter. However, it should be understood that the detailed description and specific embodiments, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the attached drawings:

FIG. 2 is a flow chart showing a manufacturing method of a nitride semiconductor substrate according to the first embodiment of the present invention;

FIGS. 11A and 11B are sectional views respectively showing a process in which the nitride semiconductor layer is joined to a second substrate, according to the first embodiment of the present invention;

FIGS. 20A through 20E are sectional views for illustrating a manufacturing process of a semiconductor substrate according to the fourth embodiment of the present invention;

DETAILED DESCRIPTION OF THE PREFERRED EMBODIMENT

Hereinafter, embodiments of the present invention will be described with reference to drawings. The present invention is not limited to the embodiment described below, and modifications and improvements may be made to the invention without departing from the spirit and scope of the invention.

First Embodiment

FIGS. 1A through 13B are views for illustrating a separation method of a semiconductor layer (i.e., a semiconductor thin film) and a manufacturing method of a nitride semiconductor device according to the first embodiment of the present invention.

Figure 1A:
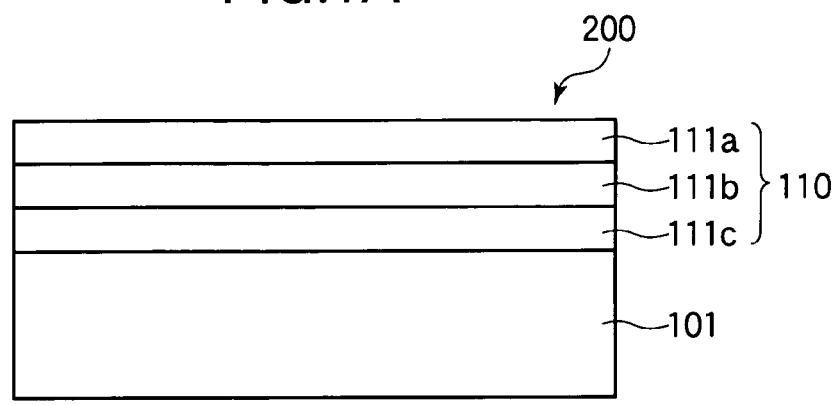
FIG. 1A is a sectional view showing a graphene-layer-grown substrate according to a first embodiment of the present invention.

FIG. 1A shows a graphene-layer-grown substrate 200 (i.e., a substrate with an epitaxial graphene layer) according to the first embodiment of the present invention. The graphene-layer-grown substrate 200 includes a SiC substrate 101 as a first substrate (i.e., a semiconductor substrate) and an epitaxial graphene layer 110 formed on the substrate 101. The epitaxial graphene layer 110 is in the form of a single layer, or two or more layers. In this example, the epitaxial graphene layer 110 includes three graphene layers 111a, 111b and 111c.

Figure 1B:
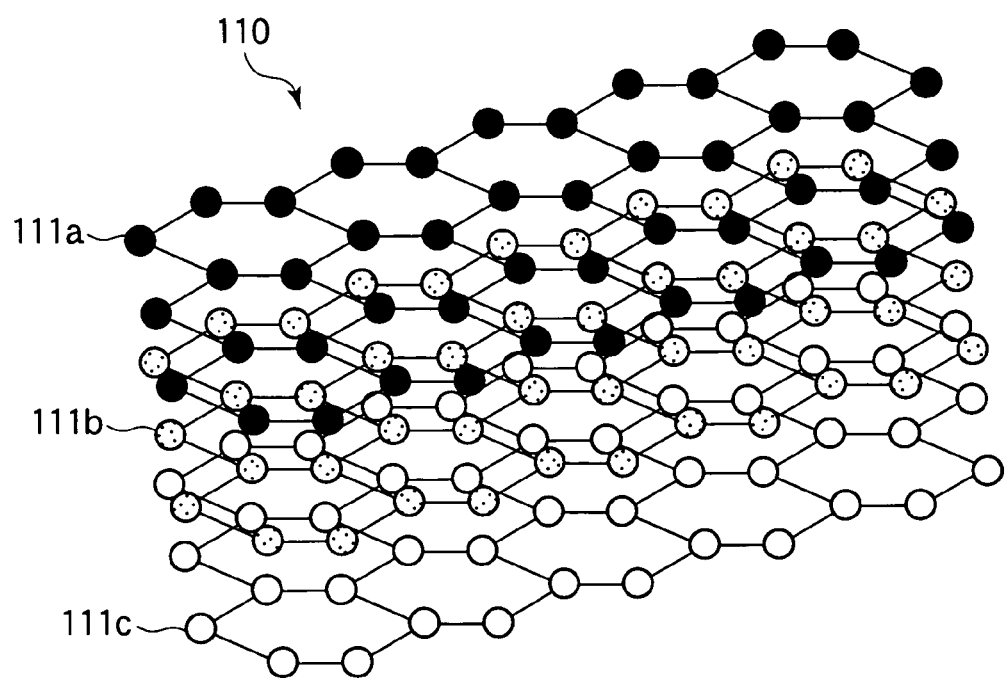
FIG. 1B is a schematic perspective view showing a structure of the epitaxial graphene layer.

FIG. 1B schematically shows a structure of the epitaxial graphene layer 110. The epitaxial graphene layer 110 includes three graphene layers 111a, 111b and 111c which are layered. The graphene layers 111a, 111b and 111c are not covalently-joined, but are joined to each other by weak force such as van der Waals force. Each of the graphene layers 111a, 111b and 111c forms a two-dimensional sheet composed of carbon (C) atoms which are bonded into hexagonal honeycomb-like structure. In FIG. 1B, the carbon atoms of the graphene sheet 111a are shown by black circles, the carbon atoms of the graphene sheet 111b are shown by dotted circles, and carbon atoms of the graphene sheet 111c are shown by white circles.

A graphene is a new material with a unique band-structure and described as massless fermions. A graphene substantially has electrical properties (for example, ballistic transport) similar to that of carbon nanotubes (CNT) having a cylindrical shape. Unlike CNTs, a graphene has a sheet-like structure, and therefore compatible with microfabrication process (for conventional LSI), which is advantageous in facilitating integration.

Next, a method of separating a nitride semiconductor layer from the SiC substrate, and joining the nitride semiconductor layer to another substrate will be described with reference to FIG. 2. FIG. 2 is a flow chart showing a manufacturing method of the nitride semiconductor substrate according to the first embodiment.

First, the graphene layers 111a, 111b and 111c are grown on the SIC substrate 101 (step S1). Then, a nitride semiconductor layer 114 is grown on a surface of the graphene layers 111a, 111b and 111c (step S2). Then, the nitride semiconductor layer 114 is divided into a plurality of regions (step S3). Then, the nitride semiconductor layer 114 having been divided into regions is separated from the SiC substrate 101 (step S4). Then, the nitride semiconductor layer 114 is joined to another substrate, i.e., a second substrate which is different from the SiC substrate 101 (step S5). The nitride semiconductor layer 114 (particularly, GaN) has a hexagonal crystal structure whose symmetry is close to that of the epitaxial graphene layer 110, and therefore the nitride semiconductor layer 114 is joined to the graphene layer 110 only by physical bonding. For this reason, after the nitride semiconductor layer 114 is separated from the epitaxial graphene layer 110, crystal defects are not generated on a separation surface of the nitride semiconductor layer 114. That is, the separation surface the nitride semiconductor layer 114 has a flatness on the order of nanometer. Therefore, the nitride semiconductor layer 114 (having been separated from the graphene layer 110) can be joined to the second substrate 130 (described later) by intermolecular force.

In the step S1, the epitaxial graphene layer 110 (i.e., the graphene layers 111a, 111b and 111c) is grown on the SiC substrate 101, so that the graphene-layer-grown substrate 200 (FIG. 1A) is obtained. The epitaxial graphene layer 110 is formed by performing high-temperature hydrogen etching process and high-temperature heating process on a surface of the SiC substrate 101 (see, Japanese Laid-Open Patent Publication No. 2009-62247).

Figure 3:
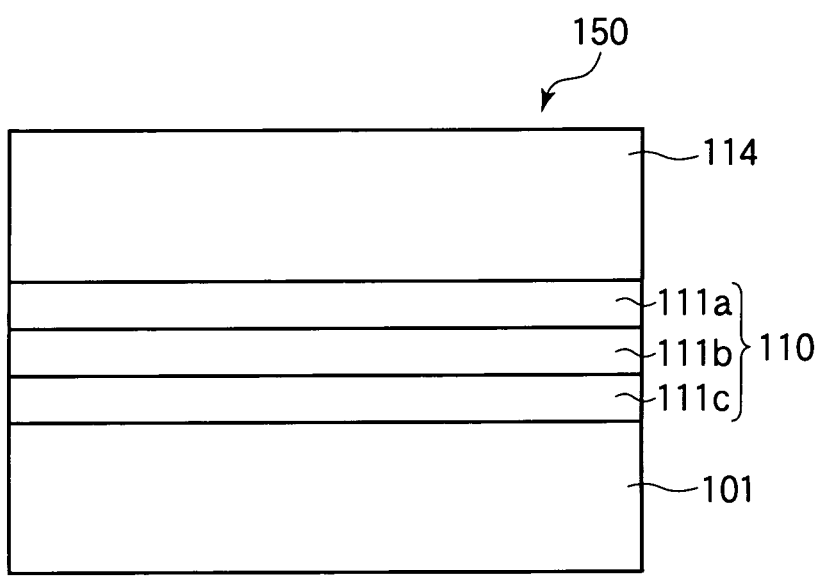
FIG. 3 is a sectional view showing the graphene-layer-grown substrate with a nitride semiconductor layer according to the first embodiment of the present invention.

Here, the process (step S2) for growing the nitride semiconductor layer 114 on the surface of the graphene-layer grown substrate 200 (FIG. 1A) will be described with respect to FIG. 3. A description herein will be made under the assumption that the nitride semiconductor is GaN. The graphene-layer-grown substrate 200 is placed in a crystal growth apparatus such as an MBE (Molecular Beam Epitaxy) apparatus or MOCVD (Metal Organic Chemical Vapor Deposition) apparatus. Then, the graphene-layer-grown substrate 200 is heated in the crystal growth apparatus, and gallium (Ga) and activated nitrogen are supplied to the crystal growth apparatus. The activated nitrogen is supplied by an electron cyclotron resonance (ECR) or a high-frequency excited radical source.

In this process, gallium (Ga) is adsorbed to a center portion of the honeycomb structure of carbon atoms of the graphene layer, so that a first layer having six-fold symmetry is formed. Further, activated nitrogen (N) is bonded to the first layer of gallium (Ga), so that a first layer of hexagonal GaN (h-GaN) is formed. Gallium (Ga) is not covalently bonded to the epitaxial graphene layer 110 (the graphene layers 111a, 111b and 111c), and therefore crystal defects due to lattice mismatch does not occur. For this reason, the nitride semiconductor layer 114 can be separated from the graphene layers 111a, 111b and 111c without causing crystal defects. The separated nitride semiconductor layer 114 has a separation surface with a flatness on the order of nanometers, and therefore the nitride semiconductor layer 114 can be joined to another substrate (i.e., the second substrate 130 described later) using intermolecular force.

By growing second and third GaN layers (and succeeding GaN layers if needed) on the first GaN layer, a single crystal GaN layer with a predetermined number of layers is formed. Since the first layer of GaN has no crystal defects (due to lattice mismatch), the resultant nitride semiconductor (GaN) layer has substantially no crystal defects. Thus, a high quality single crystal semiconductor layer is obtained. With such a process, the nitride semiconductor layer 114 having a predetermined structure is formed on the surface of the epitaxial graphene layer 110 as shown in FIG. 3. As a result, a nitride-semiconductor-layer/graphene-layer grown substrate 150 is formed as shown in FIG. 3.

Figure 4A:
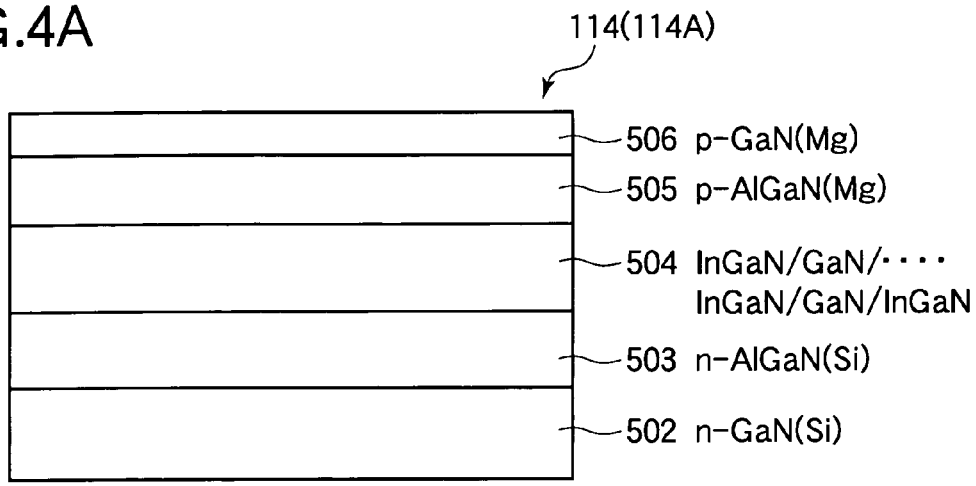
FIGS. 4A, 4B and 4C are sectional views respectively showing examples of the nitride semiconductor layer according to the first embodiment of the present invention.
Figure 4B:
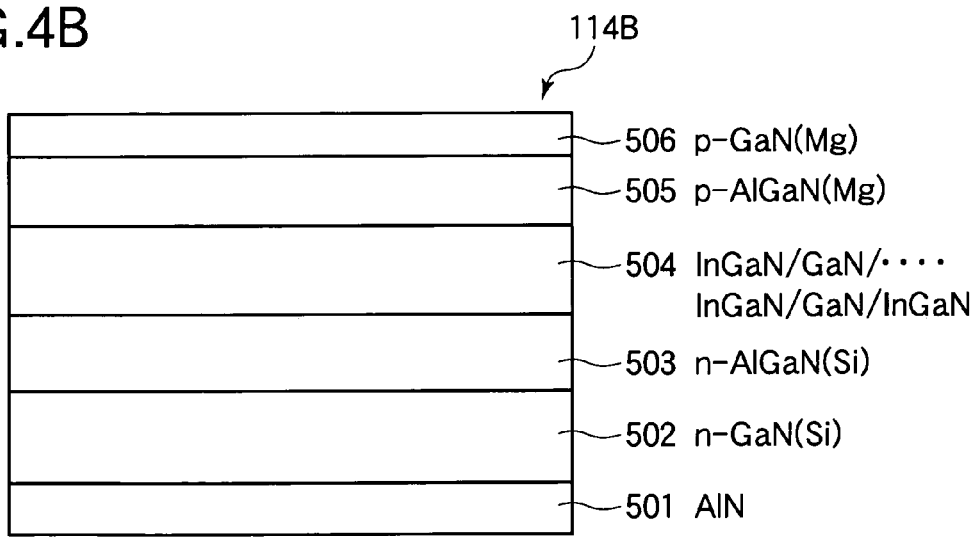

FIGS. 4A and 4B show examples of the nitride semiconductor layer 114 that constitute light emitting elements.

A nitride semiconductor layer 114A shown in FIG. 4A includes an n-type GaN layer 502, an n-type $Al_sGa_{1-s}N$ ($1 \geq s \geq 0$) layer 503, a multiquantum well layer 504, a p-type $Al_tGa_{1-t}N$ ($1 \geq t \geq 0$) layer 505 and a p-type GaN layer 506 which are layered in this order. The n-type GaN layer 502 and the n-type $Al_sGa_{1-s}N$ layer 503 are doped with Si. The p-type $Al_tGa_{1-t}N$ layer 505 and the p-type GaN layer 506 are doped with Mg. The multiquantum well layer 504 is composed of, for example, $Ga_yIn_{1-y}N/Ga_xIn_{1-x}N/ \ldots /Ga_xIn_{1-x}N/Ga_yIn_{1-y}N/Ga_xIn_{1-x}N$ ($1 \geq y \geq x \geq 0$).

A nitride semiconductor layer 114B shown in FIG. 4B includes a buffer layer 501 between the epitaxial graphene layer 110 (FIG. 3) and the n-type GaN layer 502 of the nitride semiconductor layer 114A (FIG. 4A). The buffer layer 501 contains at least Ga. The buffer layer 501 is composed of, for example, $Ga_iIn_{1-i}N$ ($1 \geq i \geq 0$) or $Al_jGa_{1-j}N$ ($1 \geq j \geq 0$).

Figure 4C:
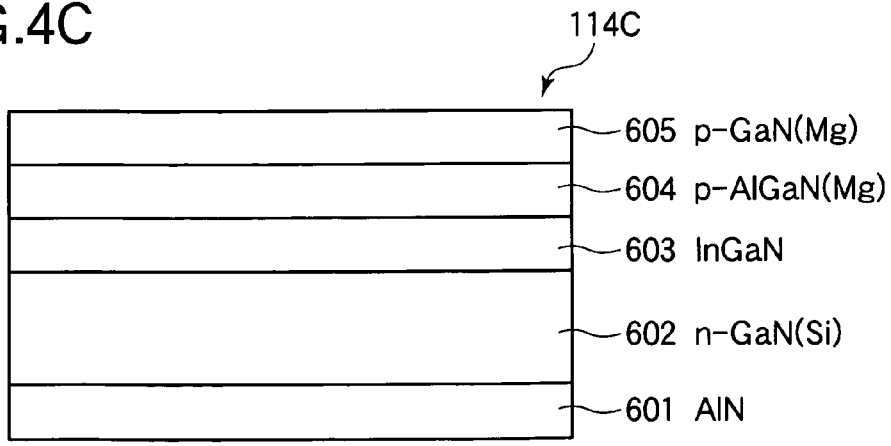

A nitride semiconductor layer 114C shown in FIG. 4C includes a buffer layer 601 (for example, $Ga_iIn_{1-i}N$ ($1 \geq i \geq 0$) or $Al_jGa_{1-j}N$ ($1 \geq j \geq 0$)), an n-type GaN layer 602, an n-type $Ga_xIn_{1-x}N$ ($1 \geq x \geq 0$) layer 603, a p-type $Al_yGa_{1-y}N$ ($1 \geq y \geq 0$) layer 604 and a p-type GaN layer 605 which are layered in this order. The n-type GaN layer 602 is doped with Si. The p-type $Al_yGa_{1-y}N$ layer 604 and the p-type GaN layer 605 are doped with Mg. The buffer layer 601 can be omitted as necessary.

FIGS. 5A, 5B, 6A and 6B show examples of the nitride semiconductor layer that constitute other elements than light emitting elements.

Figure 5A:
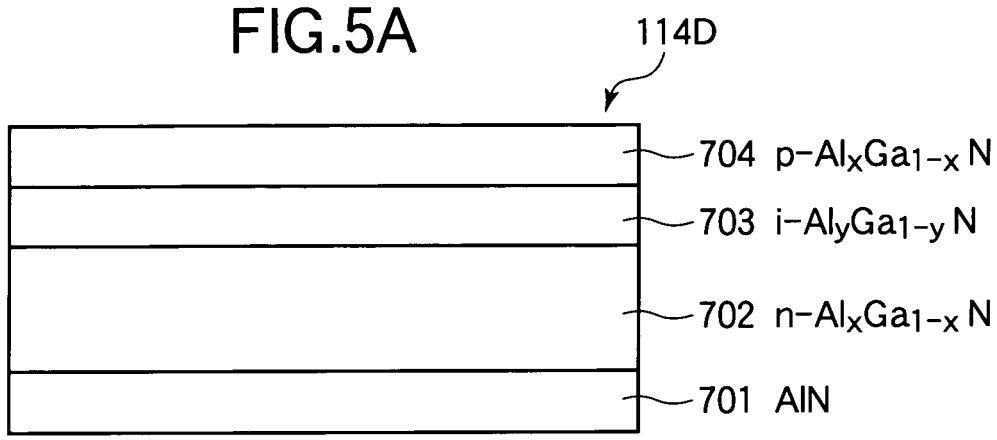
FIGS. 5A and 5B are sectional views respectively showing examples of the nitride semiconductor layer according to the first embodiment of the present invention.

A nitride semiconductor layer 114D shown in FIG. 5A is used as, for example, a photodiode. The nitride semiconductor layer 114D includes a buffer layer 701 (for example, $Ga_iIn_{1-i}N$ ($1 \geq i \geq 0$) or $Al_jGa_{1-j}N$ ($1 \geq j \geq 0$)), an n-type $Al_xGa_{1-x}N$ ($1 \geq x \geq 0$) layer 702, an i-type (intrinsic) $Al_yGa_{1-y}N$ ($1 \geq y \geq 0$) layer 703 and a p-type $Al_xGa_{1-x}N$ ($1 \geq x \geq 0$) layer 704 which are layered in this order. The buffer layer 701 can be omitted as necessary.

Figure 5B:
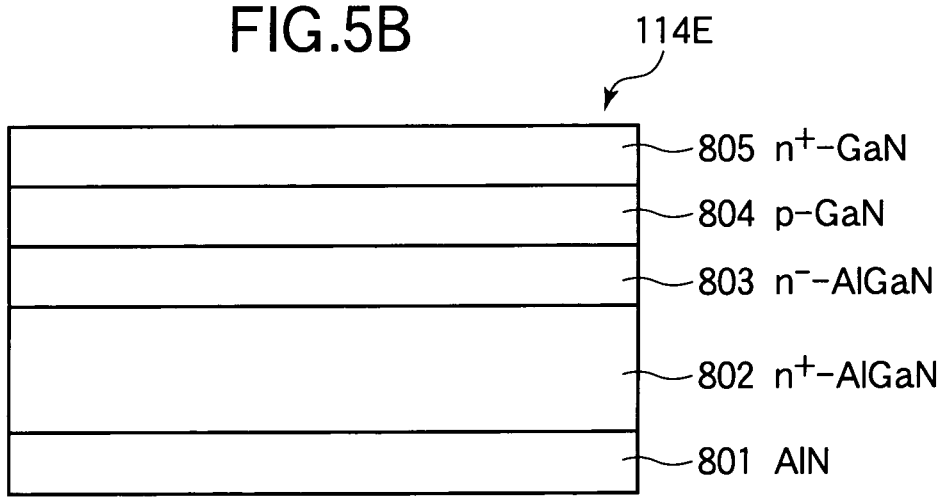

A nitride semiconductor layer 114E shown in FIG. 5B is used as, for example, an HB-type (Hetero-Bipolar type) phototransistor. The nitride semiconductor layer 114E includes a buffer layer 801 (for example, $Ga_iIn_{1-i}N$ ($1 \geq i \geq 0$) or $Al_jGa_{1-j}N$ ($1 \geq j \geq 0$)), an $n^+$-type $Al_xGa_{1-x}N$ ($1 \geq x \geq 0$) layer 802, an $n^-$-type $Al_yGa_{1-y}N$ ($1 \geq y \geq 0$) layer 803, a p-type GaN layer 804 and $p^+$-GaN layer 805 which are layered in this order. The buffer layer 801 can be omitted as necessary.

Figure 6A:
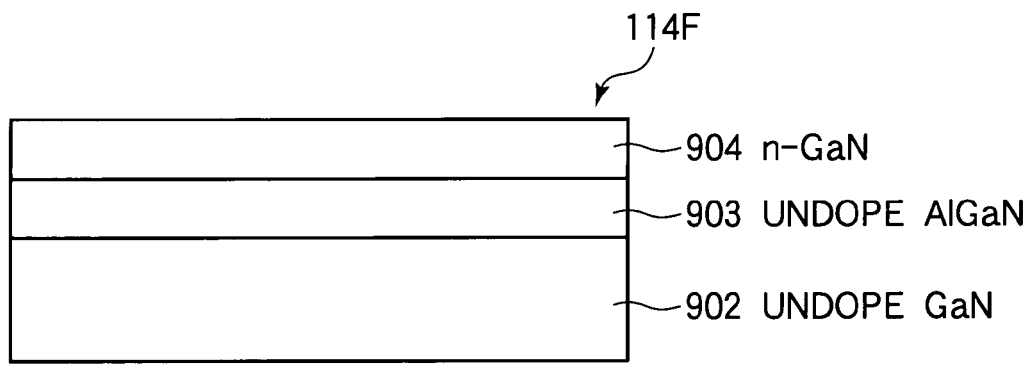
FIGS. 6A and 6B are sectional views respectively showing examples of the nitride semiconductor layer according to the first embodiment of the present invention.

A nitride semiconductor layer 114F shown in FIG. 6A is used as, for example, HEMT (High Electron Mobility Transistor). The nitride semiconductor layer 114F includes an undoped GaN layer 902, an undoped $Al_xGa_{1-x}N$ ($1 \geq x \geq 0$) layer 903 and an n-type GaN layer 904 which are layered in this order.

Figure 6B:
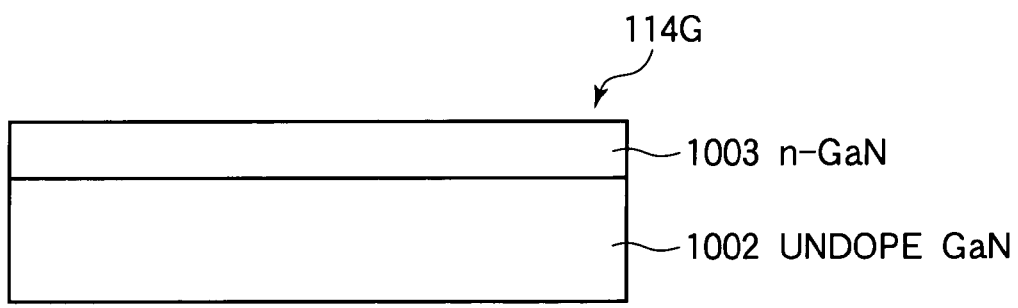

A nitride semiconductor layer 114G shown in FIG. 6B is used as, for example, MESFET (Metal Semiconductor Field Effect Transistor). The nitride semiconductor layer 114G includes an undoped GaN layer 1002 and an n-type GaN layer 1003 which are layered in this order. In the nitride semiconductor layers 114F and 114G shown in FIGS. 6A and 6B, it is also possible to provide a buffer layer (for example, $Ga_iIn_{1-i}N$ ($1 \geq i \geq 0$) or $Al_jGa_{1-j}N$ ($1 \geq j \geq 0$)) below the undoped GaN layer 902 or the undoped GaN layer 1002.

The step S3 (FIG. 2) for dividing the nitride semiconductor layer 114 into a plurality of regions (with predetermined shapes) can be omitted in this embodiment.

Next, a separation of the nitride semiconductor layer 114 from the SiC substrate 101 (step S4 in FIG. 2) will be described.

First, a supporting body adhesion layer 122 is formed on the stack of the nitride semiconductor layer 114 and the epitaxial graphene layer 110 on the SiC substrate 101. The supporting body adhesion layer 122 exhibits high adherence with the nitride semiconductor layer 114.

An adhesive force (i.e., adhesive strength) between the surface of the supporting body adhesion layer 122 and the surface of the nitride semiconductor layer 114 is preferably greater than intermolecular force between the nitride semiconductor layer 114 and the graphene layer 111. The supporting body adhesion layer 122 is preferably composed of material with adhesiveness such as organic coating material that can be removed (exfoliated) using a removing liquid, or adhesive agent that exhibits removability when applied with heat, ultraviolet rays or the like.

Figure 7A:
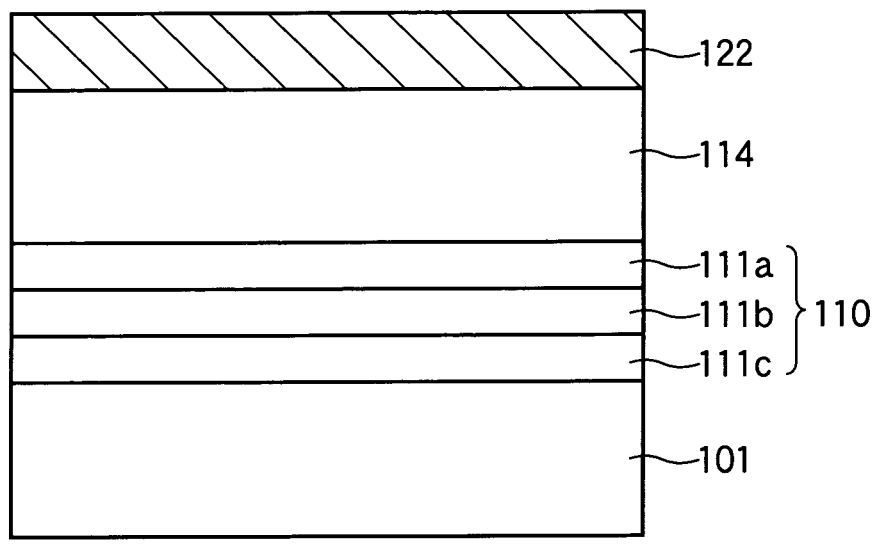
FIG. 7A is a sectional view showing the graphene-layer grown substrate with the nitride semiconductor layer on which a supporting body adhesion layer is provided, according to the first embodiment of the present invention.
Figure 7B:
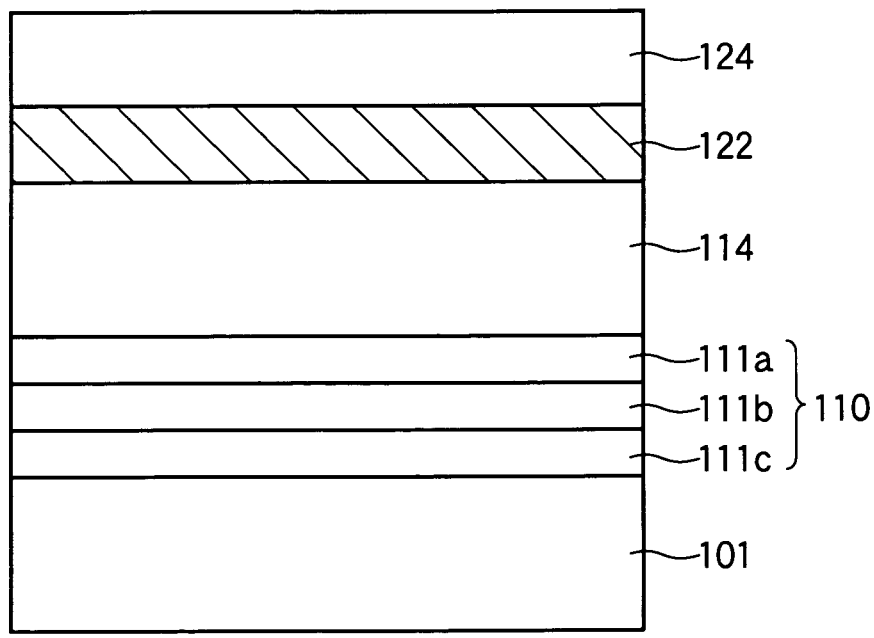
FIG. 7B is a sectional view showing the graphene-layer-grown substrate with the nitride semiconductor layer on which the supporting body adhesion layer and a supporting body are provided, according to the first embodiment of the present invention.

Further, as shown in FIG. 7B, a supporting body 124 is adhered to the surface of the supporting body adhesion layer 122, for supporting the nitride semiconductor layer 114 (or the stack of the nitride semiconductor layer 114 and the epitaxial graphene layer 110) during the separation process thereof. The supporting body 124 has a function to support the nitride semiconductor layer 114 (or the stack of the nitride semiconductor layer 114 and the epitaxial graphene layer 110) after separation. The supporting body 124 preferably has an adhesion surface adhering to the supporting body adhesion layer 122 with an adhesive strength greater than intermolecular force between the respective graphene layers 111a, 111b and 111c. The supporting body 124 is preferably composed of a glass substrate, a ceramic substrate, a quartz substrate, a semiconductor substrate such as Si or the like.

Figure 8A:
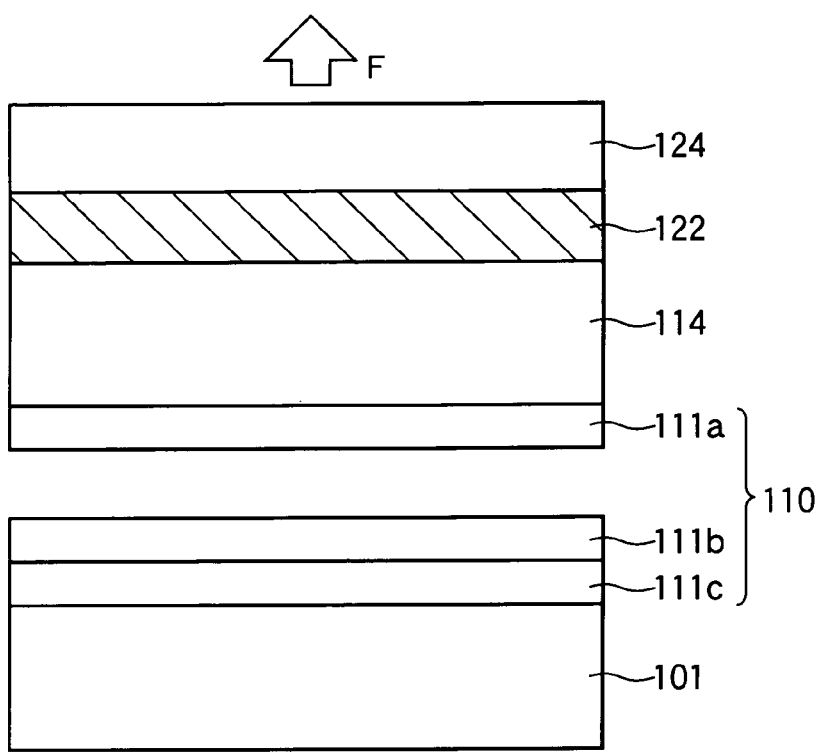
FIG. 8A is a sectional view showing a process where the supporting body is pulled so as to cause a separation between graphene layers at a bonding surface, according to the first embodiment of the present invention.
Figure 8B:
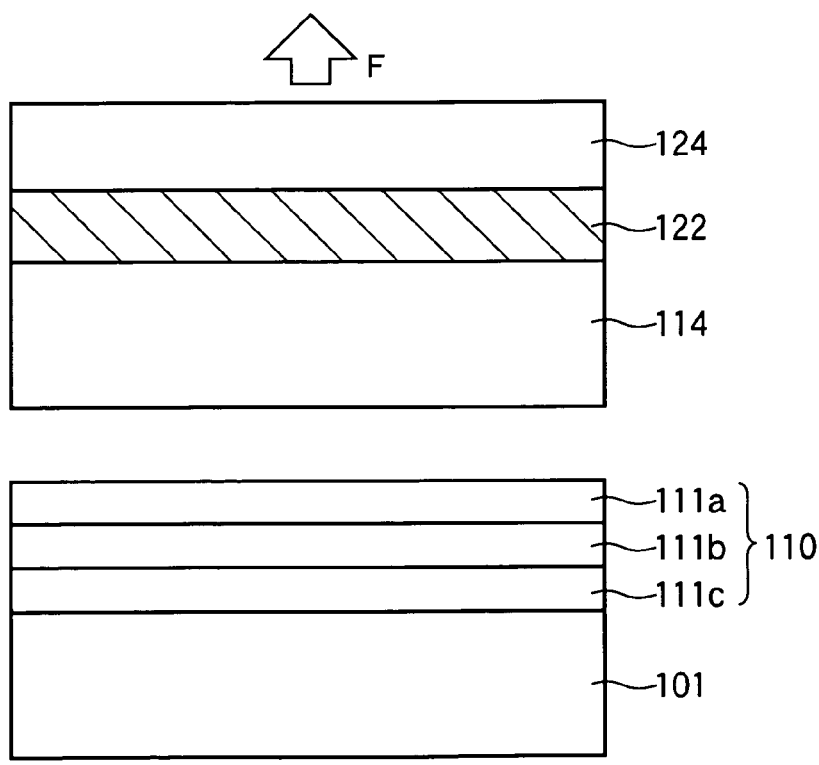
FIG. 8B is a sectional view showing a process in which the supporting body is pulled so as to cause a separation of the nitride semiconductor layer from the epitaxial graphene layer at a bonding surface therebetween, according to the first embodiment of the present invention.

FIGS. 8A and 8B show a process in which the supporting body 124 is pulled upward so as to separate the nitride semiconductor layer 114 from the SiC substrate 101 (step S4 in FIG. 2).

After the stack of the epitaxial graphene layer 110, the nitride semiconductor layer 114, the supporting body adhesion layer 122 and the supporting body 124 is formed, the supporting body 124 is pulled away from the SiC substrate 101 with a force F greater than the intermolecular force between the graphene layers 111a, 111b and 111c as shown in FIG. 8A, so that the graphene layer 111a and the graphene layer 111b are separated from each other. Alternatively, if the supporting body 124 is pulled away from the SiC substrate 101 with a force F greater than the intermolecular force between the nitride semiconductor substrate 114 and the epitaxial graphene layer 110 (i.e., the uppermost graphene layer 111a), the nitride semiconductor layer 114 is separated from the graphene layer 111a as shown in FIG. 8B.

In this regard, FIG. 8A shows a state where the nitride semiconductor layer 114 and the graphene layer 111a are separated from the SiC substrate 101. However, it is also possible that the nitride semiconductor layer 114 and the graphene layers 111a and 111b are separated from the SiC substrate 101.

Figure 9A:
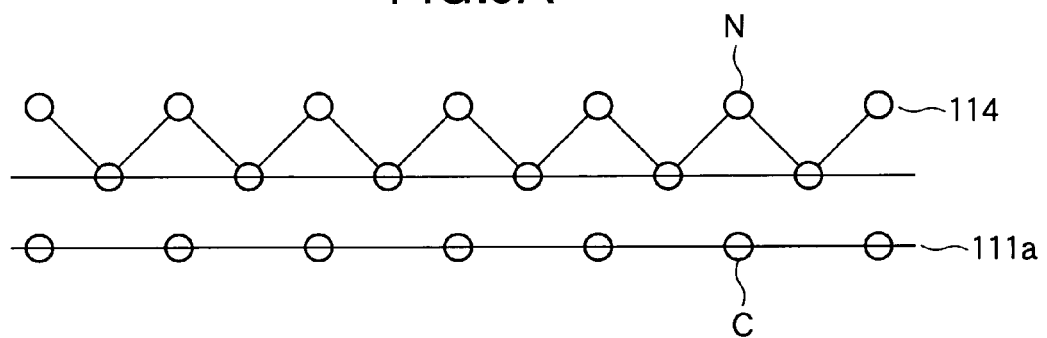
FIGS. 9A and 9B are schematic views showing states at the bonding surface between the nitride semiconductor layer and the epitaxial graphene layer, according to the first embodiment of the present invention.
Figure 9B:
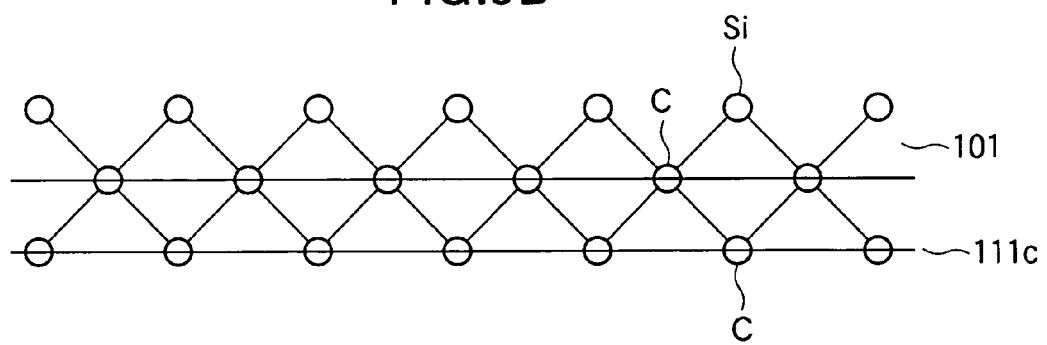

FIGS. 9A and 9B are schematic views for illustrating intermolecular force between the nitride semiconductor layer 114 and the graphene layer 111a. FIG. 9A shows an interface between the nitride semiconductor layer 114 and the graphene layer 111a. FIG. 9B shows a state where, for example, the SiC substrate 101 and the graphene layer 111c are directly joined to each other.

The nitride semiconductor layer 114 (particularly, GaN) has a crystal structure of hexagonal column. On each end surface of the hexagonal column, nitrogen (N) atoms are bonded to each other two-dimensionally in a hexagonal shape. In the graphene layer 111a, carbon (C) atoms are bonded to each other two-dimensionally in a hexagonal shape (see, FIG. 1B). Therefore, as shown in FIG. 9A, nitrogen atoms (arranged in a hexagon) are disposed in between carbon atoms. Therefore, the nitride semiconductor layer 114 and the graphene layer 111a are not covalently bonded to each other, but are physically bonded to each other due to regularity of potential at the surfaces (i.e., regularity of potential at atomic level at an interface therebetween).

FIG. 9B shows a state where, for example, the SiC substrate 101 and the graphene layer 111c are directly joined to each other. The SiC substrate 101 has a crystal structure of tetrahedron. If the layers of SiC are stacked so that two layers form a stacking period, the SiC substrate 101 has a hexagonal symmetry. Therefore, the SiC substrate 101 is similar to the graphene layer 111c in having the hexagonal symmetry. However, the SiC substrate 101 does not have a hexagonal symmetry at a joint surface (i.e., a single layer). Therefore, the SiC substrate 101 and the graphene layer 111c are covalently bonded to each other. In other words, the SiC substrate 101 and the graphene layer 111c are not only bonded to each other by a weak force due to the regularity of potential, but also bonded to each other by a strong force via bonds.

To be more specific, the bonding between the nitride semiconductor layer 114 and the graphene layer 111a, and the bonding between the graphene layers 111a and 111b are relatively weak. In contrast, the bonding between the SiC substrate 101 and the graphene layer 111c is strong. In this regard, a metamorphic layer is formed between the nitride semiconductor layer 114 and the graphene layer 111a, and therefore the bonding between the nitride semiconductor layer 114 and the graphene layer 111a is stronger than the bonding between the graphene layers 111a and 111b.

Figure 10:
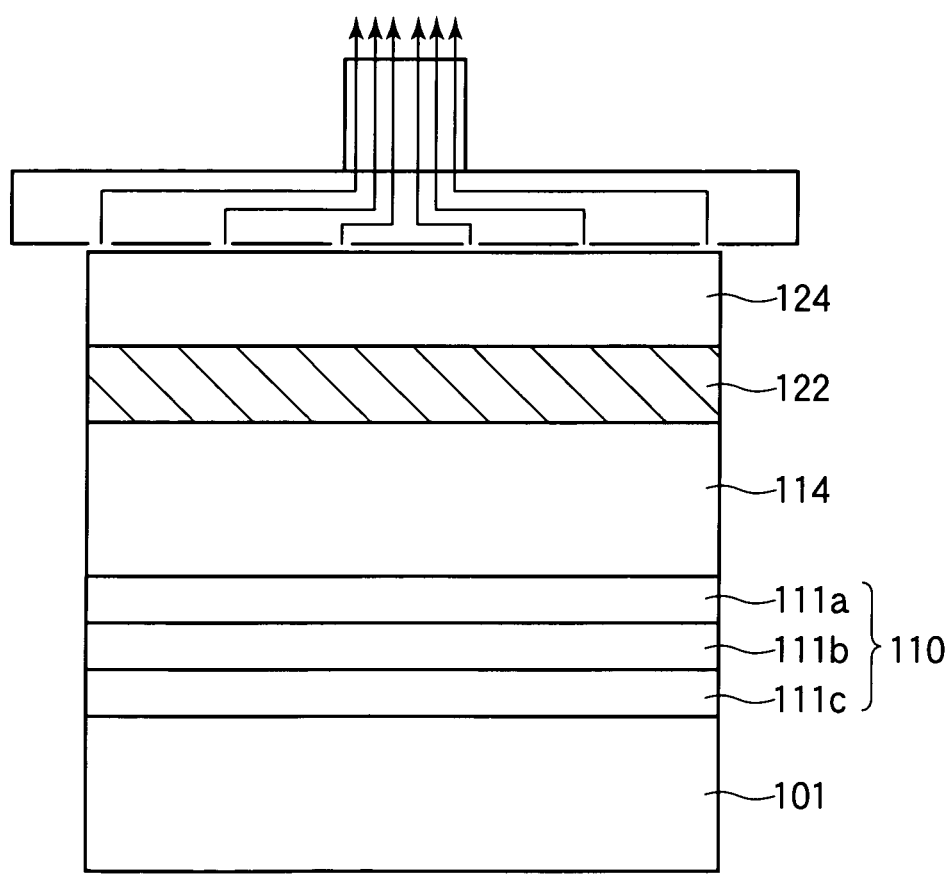
FIG. 10 is a sectional view for illustrating a process separating the nitride semiconductor layer from a SiC substrate by means of vacuum suction, according to the first embodiment of the present invention.

Accordingly, for example, when the supporting substrate 124 is pulled upward by vacuum adsorption as shown in FIG. 10, the graphene layers 111a and 111b can be separated from each other, or the nitride semiconductor layer 103 can be separated from the graphene layer 111a, without forming crystal defects on the separation surface. Therefore, the separation surface has a flatness on the order of nanometers.

After the nitride semiconductor layer 114 is separated from the SiC substrate 101 (see FIG. 8I3), the nitride semiconductor layer 114 is brought into direct contact with the surface of another substrate (i.e., the second substrate 130) as shown in FIG. 11A, and is fixed to the surface of the second substrate 130. Alternatively, after the nitride semiconductor layer 114 and the graphene layer 111a are separated from the SiC substrate 101 (see FIG. 8A), the nitride semiconductor layer 114 and the graphene layer 111a are brought into direct contact with the surface of another substrate (i.e., the second substrate 130) as shown in FIG. 11B, and is fixed to the surface of the second substrate 130. With such a process, the surface of the second substrate 130 and surface of the nitride semiconductor layer 114 (or the surface of the graphene layer 111a) are joined to each other by intermolecular force (see, step S5 (FIG. 2)).

Figure 12:
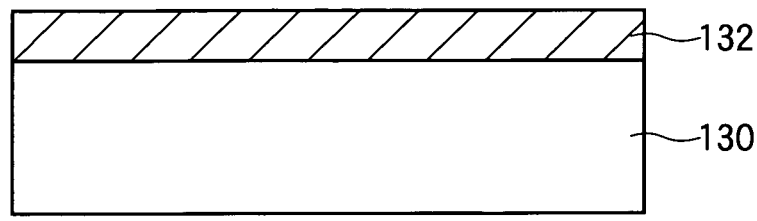
FIG. 12 is a sectional view showing a structure of the second substrate with a joining layer formed thereon, according to the first embodiment of the present invention.

In this regard, the nitride semiconductor layer 114 (or the nitride semiconductor layer 114 and the graphene layer 111a) can be brought into direct contact with a surface of a joining layer 132 formed on the second substrate 130 as shown in FIG. 12, so as to be directly joined to the surface of the joining layer 132 by intermolecular force.

If the nitride semiconductor layer 114 (or the nitride semiconductor layer 114 and the graphene layer 111a) is joined to the second substrate 130 by intermolecular force, it is preferred that the surface of the nitride semiconductor layer 114 (or the graphene layer 111a) has a flatness on the order of nanometers. In this regard, "the flatness on the order of nanometers" means that the surface roughness (to be more specific, a maximum valley depth Rrv, i.e., a maximum peak-to-valley difference) measured using an atomic force microscope (AFM) is smaller than 10 nm. It is more preferred that the surface roughness Rrv of the surface of the joining layer 132 formed on the second substrate 130 is smaller than or equal to 3 nm.

The second substrate 130 is preferably, for example, a Si substrate, a ceramic substrate such as AlN substrate, a glass substrate, a quartz substrate, a plastic substrate or a metal substrate. The joining layer 132 formed on the second substrate 130 is preferably composed of material selected among, for example, $SiO_2$, SiN, SiON, PSG, BSG, SOG, metal or organic substance. The joining layer 132 is formed using, for example, plasma CVD method, CVD method or sputtering method.

In this regard, it is also possible that the nitride semiconductor layer 114 (or the graphene layer 111a) is joined to the second substrate 130 (or the joining layer 132) by means of atomic diffusion or compound formation via the interface, instead of intermolecular force.

Figure 13A:
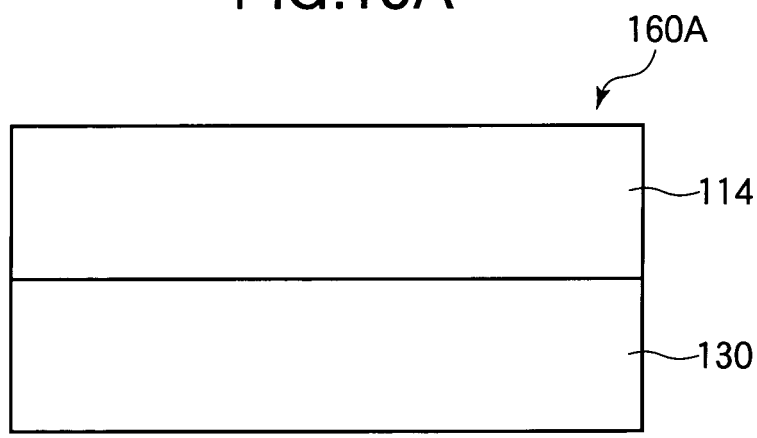
FIGS. 13A and 13B are sectional views respectively showing structures of the second substrate with the nitride semiconductor layer joined thereto, according to the first embodiment of the present invention.
Figure 13B:
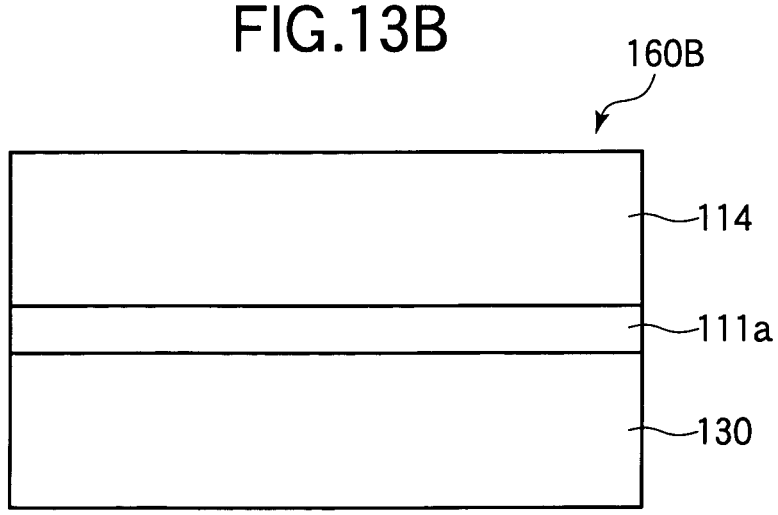

After the nitride semiconductor layer 114 (or the nitride semiconductor layer 114 and the graphene layer 111a) is joined to the second substrate 130 (or the joining layer 132 on the second substrate 130), the supporting body adhesion layer 122 and the supporting body 124 are removed from the surface of the nitride semiconductor layer 114, as shown in FIGS. 13A and 13B. The removing of the supporting body adhesion layer 122 and the supporting body 124 can be performed by removing the supporting body adhesion layer 122 using removing liquid, heat or ultraviolet rays. In the case where the supporting body adhesion layer 122 and the supporting body 124 are removed using removing liquid (etching liquid), it is advantageous that the supporting body 124 is made of material having corrosion-resistance against removing liquid, since the supporting body 124 can be reused.

Figure 14A:
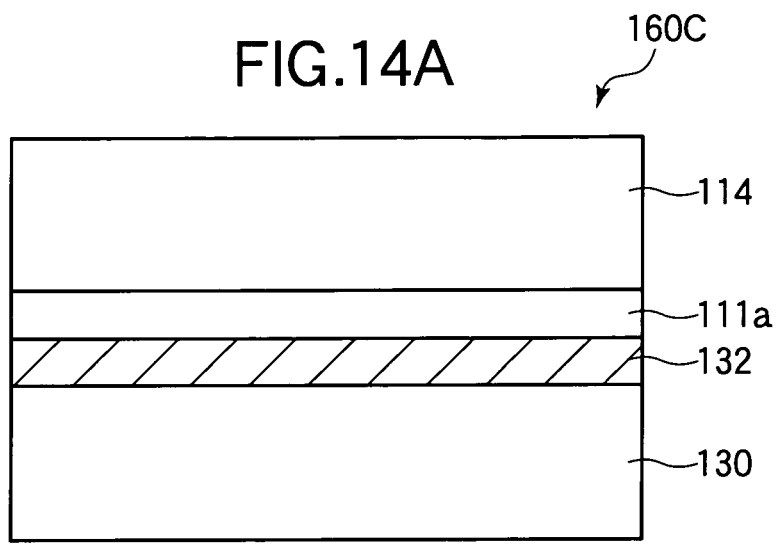
FIGS. 14A and 14B are sectional views respectively showing structures of the second substrate with the nitride semiconductor layer joined thereto via joining layers, according to the first embodiment of the present invention.
Figure 14B:
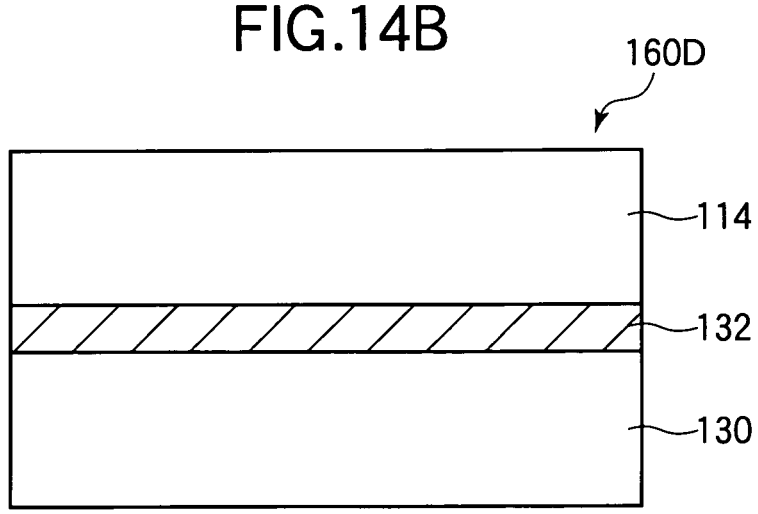

FIG. 13A shows a nitride semiconductor substrate 160A in which the nitride semiconductor layer 114 is joined to the surface of the second substrate 130. FIG. 13B shows a nitride semiconductor substrate 160B in which the stack of the nitride semiconductor layer 114 and the graphene layer 111a is joined to the surface of the second substrate 130. FIG. 14A shows a nitride semiconductor substrate 160C in which the stack of the nitride semiconductor layer 114 and the graphene layer 111a is joined to the surface of the second substrate 130 via the joining layer 132. FIG. 14B shows a nitride semiconductor substrate 160D in which the nitride semiconductor layer 114 is joined to the surface of the second substrate 130 via the joining layer 132.

In the nitride semiconductor substrate 160A shown in FIG. 13A, the nitride semiconductor layer 114 is joined to the second substrate 130 by intermolecular force. In the nitride semiconductor substrate 160B shown in FIG. 13B, the stack of the nitride semiconductor layer 114 and the graphene layer 111a is joined to the second substrate 130 by intermolecular force. In the nitride semiconductor substrate 160C shown in FIG. 14A, the stack of the nitride semiconductor layer 114 and the graphene layer 111a is joined to the second substrate 130 via the joining layer 132 by intermolecular force. In the nitride semiconductor substrate 160D shown in FIG. 14B, the nitride semiconductor layer 114 is joined to the second substrate 130 via the joining layer 132 by intermolecular force. Using the nitride semiconductor substrates 160B and 160C (FIGS. 13B and 14A) in which the stack of the nitride semiconductor layer 114 and the graphene layer 111a is joined to the second substrate 130, functional devices such as graphene transistors can be manufactured.

According to the first embodiment of the present invention, the nitride semiconductor layer 114 is grown on the epitaxial graphene layer 110 having been grown on the SiC substrate 101 (the first substrate), and the nitride semiconductor layer 114 is separated from the SiC substrate 101 using a force greater than the intermolecular force between the graphene layers 111a, 111b and 111c or greater the intermolecular force between the graphene layer 111a and the nitride semiconductor layer 114. Therefore, the nitride semiconductor layer 114 can be easily separated from the SiC substrate 101.

Further, the separation surface of the nitride semiconductor layer 114 or the graphene layer 111a has a flatness on the order of nanometers (i.e., i.e., a surface roughness smaller than 10 nm), and therefore the nitride semiconductor layer 114 (or the nitride semiconductor layer 114 and the graphene layer 111a) can easily be joined to the second substrate 130 via intermolecular force or the like.

Modification.

In the above described first embodiment, it is also possible that the supporting body adhesion layer 122 is integrally formed with the supporting body 124.

Second Embodiment

In the second embodiment of the present invention, a description will be made of a process in which the nitride semiconductor layer 114 is divided into a plurality of regions having predetermined shapes. The drawings of the first embodiment are herein referred to as necessary.

As was described in the first embodiment, the epitaxial graphene layer 110 is grown on the SiC substrate 101 (i.e., the first substrate), and the nitride semiconductor layer 114 is grown on the epitaxial graphene layer 110. The nitride semiconductor layer 114 is configured as, for example, the nitride semiconductor layer 114A, 114B, 114C, 114D, 114E, 114F or 114G shown in FIGS. 4A through 6F.

The nitride semiconductor layer 114 is fabricated into predetermined element shapes so that a plurality of elements are formed on the nitride semiconductor layer 114.

Figure 15:
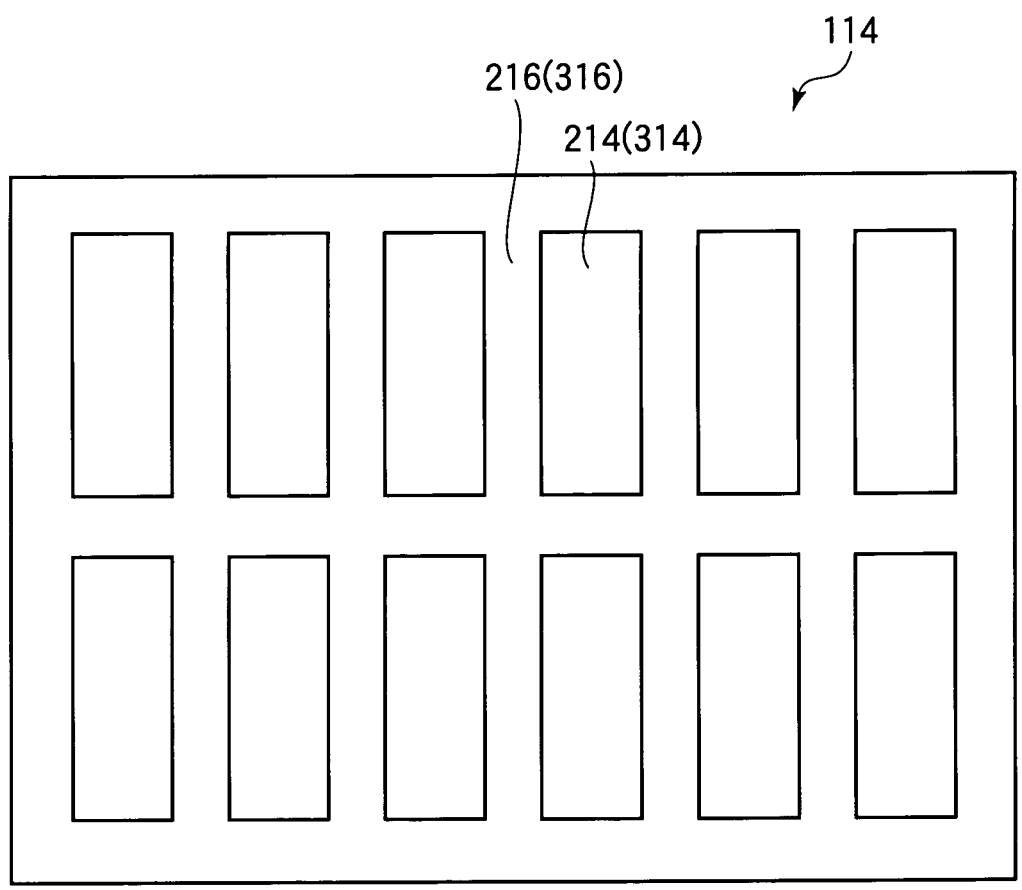
FIG. 15 is a plan view showing a nitride semiconductor layer divided into isolated islands, according to the second embodiment of the present invention.

In FIG. 15, the nitride semiconductor layer 114 is divided into a plurality of element formation regions 214 and a non-element formation region 216. The element formation regions 214 are respectively formed as isolated islands 314. The non-element formation region 216 is formed so as to include isolating grooves that isolate respective isolated islands 314. In this example, respective isolated islands 314 have elongated rectangular shapes, and arranged in two rows and six columns.

Figure 16A:
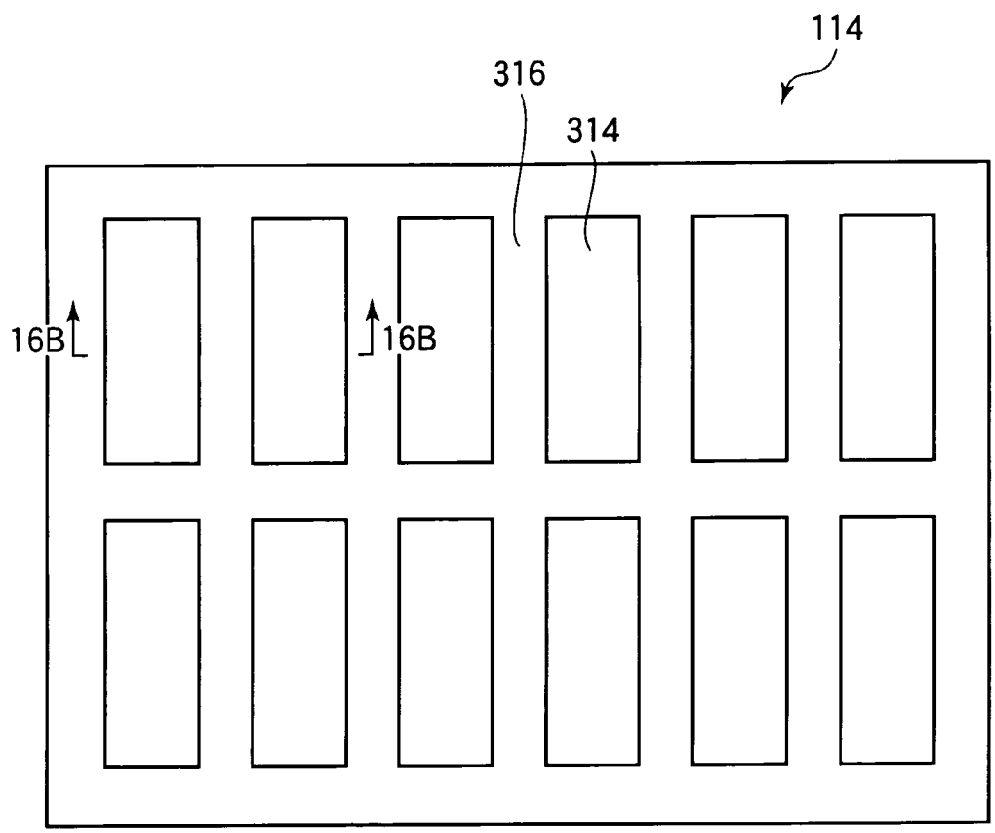
FIG. 16A is a plan view showing the nitride semiconductor layer divided into isolated islands, according to the second embodiment of the present invention.
Figure 16B:
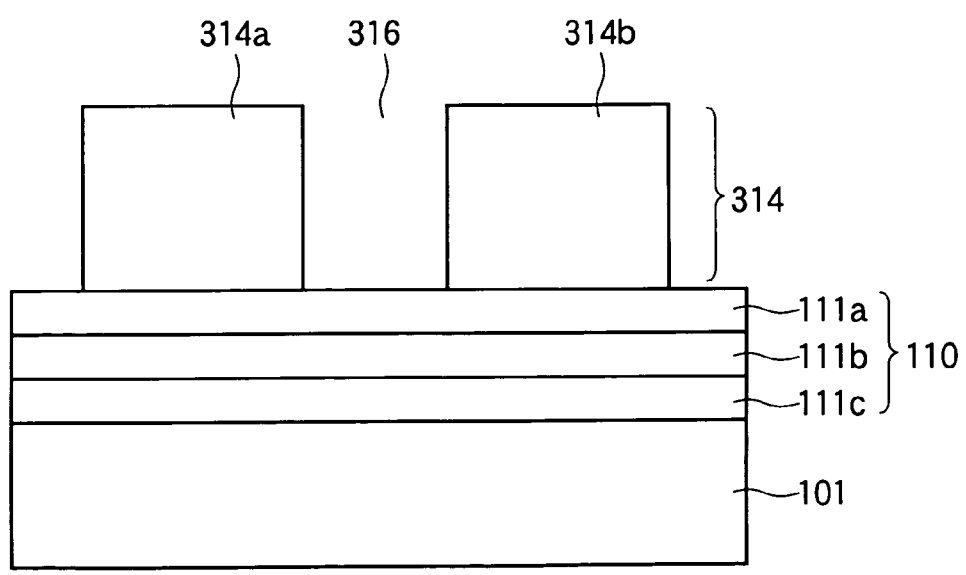
FIG. 16B is a sectional view showing the graphene-layer-grown substrate with the nitride semiconductor layer divided into isolated islands taken along line 16B-16B in FIG. 16A.

The formation of the isolated islands 314 is performed by photolithographic process and dry etching process. FIG. 16A is a plan view showing the nitride semiconductor layer 114. FIG. 16B is a sectional view of the graphene-layer-grown substrate with the nitride semiconductor layer 114 taken along line 16B-16B in FIG. 16A.

In FIG. 16B, the isolating grooves 316 are illustrated so as to reach an upper surface of the epitaxial graphene layer 110. However, the isolating grooves 316 can be formed so as to reach the surface (or inside) of the SiC substrate 101. Further, the isolating grooves 316 are not limited to vertically extending grooves.

After the isolated islands 314 of the nitride semiconductor layer are formed, the supporting body adhesion layer 122 and the supporting body 124 are formed thereon as described in the first embodiment. Thereafter, the isolated islands 314 (the nitride semiconductor layer 114) are separated from the SiC substrate 101 with a force greater than the intermolecular force between the graphene layers 111a and 111b (see, FIG. 8A). Alternatively, the isolated islands 314 (the nitride semiconductor layer 114) are separated from the SiC substrate 101 with a force greater than the intermolecular force between the graphene layer 111a and the nitride semiconductor layer 114 (see, FIG. 8B). With such a process, the isolated islands 314 are separated from the SiC substrate 101.

Figure 17:
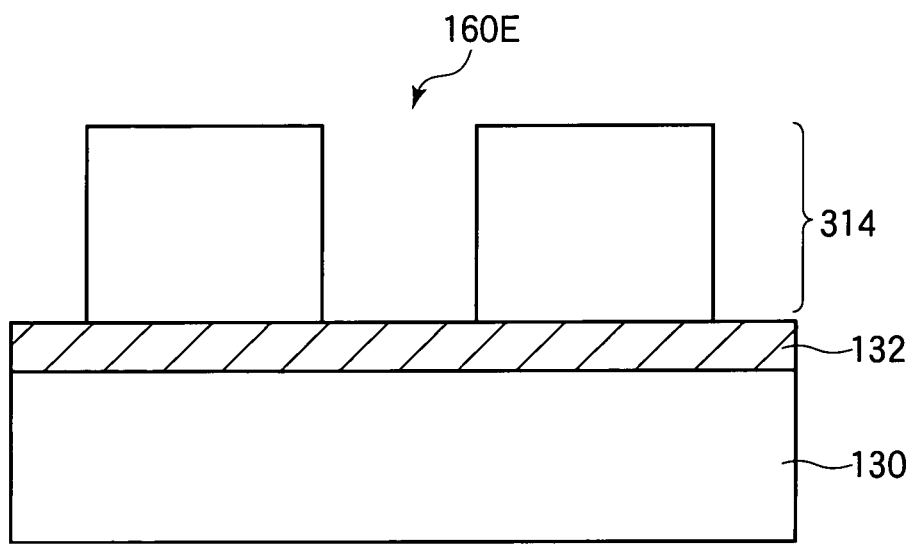
FIG. 17 is a sectional view showing the nitride semiconductor substrate with isolated islands, according to the second embodiment.

After the isolated islands 314 (i.e., the nitride semiconductor layer 114) are separated from the SiC substrate 101, the isolated islands 314 are joined to predetermined positions on the surface of another substrate (i.e., the second substrate 130) as described in the first embodiment, so as to form a nitride semiconductor substrate 160E. Alternatively, the isolated islands 314 are joined to predetermined positions on the surface of the joining layer 132 on the second substrate 130 as described in the first embodiment, so as to form a nitride semiconductor substrate 160E. FIG. 17 shows a nitride semiconductor substrate 160E in which the isolated islands 314 are joined to the surface of the joining layer 132 formed on the second substrate 130. As in the first embodiment, the separation surfaces of the isolated islands 314 (having been separated from the SiC substrate 101) have surface roughness (to be more specific, the maximum valley roughness Rrv, i.e, the maximum peak-to-valley difference) smaller than 10 nm when measured using the atomic force microscope (AFM). Since the isolated islands 314 have such flat separation surfaces, excellent joint can be obtained between the separation surfaces of the isolated islands 314 and the second substrate 130 (or the joining layer 132).

In this regard, when the nitride semiconductor layer 114 (divided into the isolated islands 314 by the isolation grooves 316) is described to form elements such as light emitting elements or electron elements, it means that the isolated islands 314 are completed as the elements which are operable. When the nitride semiconductor layer 114 is described to be in the process of forming the elements (such as light emitting elements or electron elements), it means that the isolated islands 314 have not yet been completed as the elements, and it also means that the nitride semiconductor layer 114 has not yet fabricated into predetermined elements.

As described above, according to the second embodiment of the present invention, the nitride semiconductor layer 114 is fabricated into the isolated islands 314 having predetermined shapes by forming the grooves 316, in addition to the process according to the first embodiment. Accordingly, the nitride semiconductor layer 114 (that forms the elements or that is in the process of forming the elements) can be easily separated from the SiC substrate 101.

Third Embodiment

The third embodiment of the present invention is different from the first and second embodiment in the following aspects. The nitride semiconductor layer 114 is grown on the epitaxial graphene layer 110 having been grown on the SiC substrate 101 (i.e., the first substrate), so as to form a nitride-semiconductor-layer/graphene-layer grown substrate 400. Then, a surface of the nitride-semiconductor-layer/graphene-layer grown substrate 400 (i.e., a surface of the nitride semiconductor layer 114 opposite to the graphene layer 111a side) is joined to the surface of another substrate, i.e., the second substrate 130 (or the joining layer 432 formed on the surface of the second substrate 130). Thereafter, the SiC substrate 101 is separated from the nitride semiconductor layer 104. Hereinafter, the third embodiment will be described with reference to FIGS. 18A, 18B, 19A and 19B.

Figure 18A:
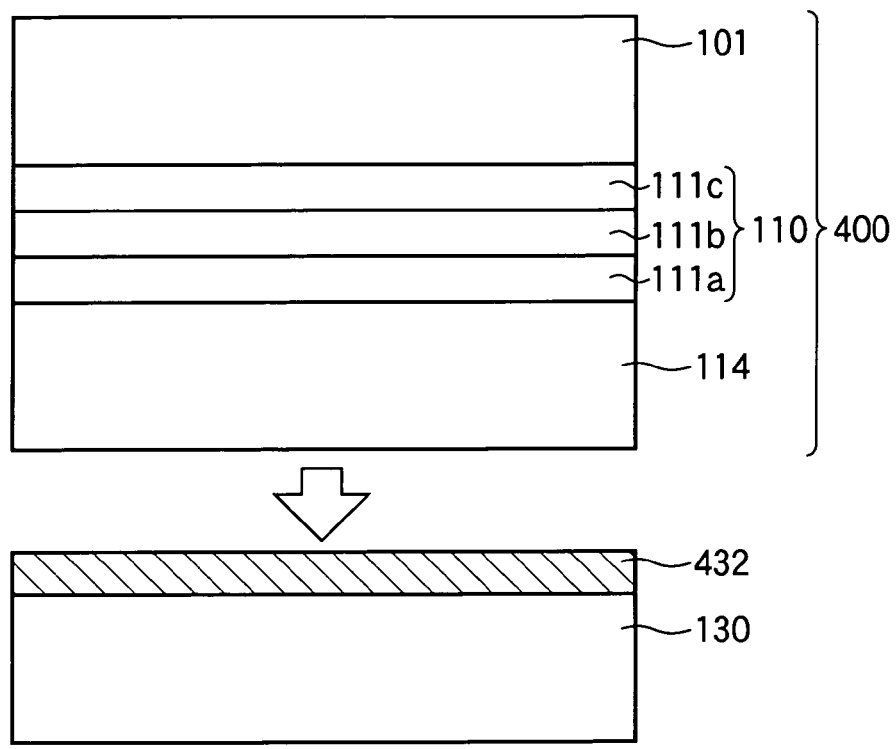
FIGS. 18A and 18B are sectional views respectively showing a process in which a stack of a SiC substrate, an epitaxial graphene layer and a nitride semiconductor layer is joined to a second substrate, according to the third embodiment of the present invention.

FIG. 18A shows a process in which the nitride-semiconductor-layer/graphene-layer grown substrate 400 (in which the epitaxial graphene layer 110 and the nitride semiconductor layer 114 are formed on the SiC substrate 101) is jointed to the second substrate 130 with the joining layer 432. The joining layer 432 has a function to joint the second substrate 130 and the nitride semiconductor layer 114 to each other with a force which is greater than a force required for separating the SiC substrate 101 as described later (FIG. 19A).

Figure 18B:
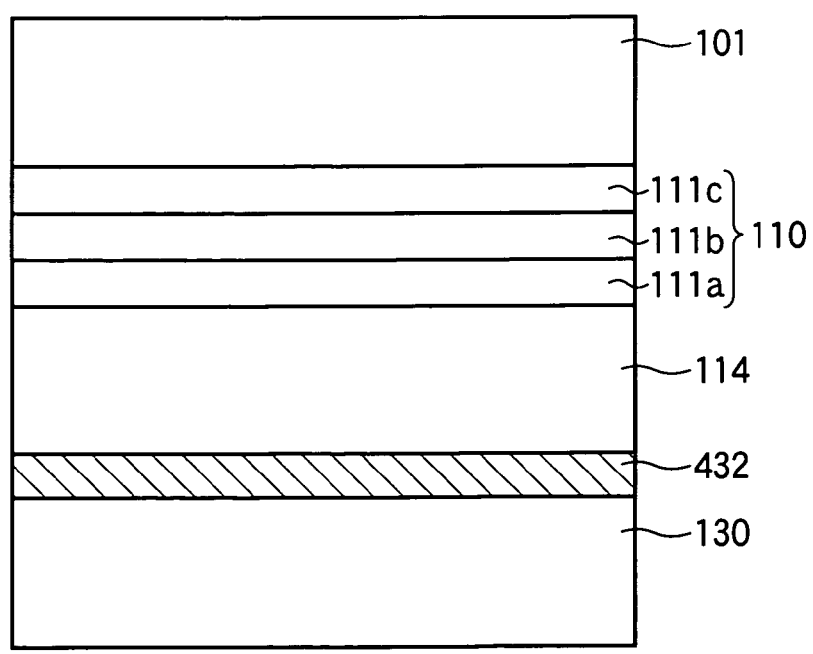

FIG. 18B shows a process in which the surface of the nitride semiconductor layer 114 is jointed to the joining layer 432. In this state, the second substrate 130, the joining layer 432, the epitaxial graphene layer 110 and the SiC substrate 101 are layered from the bottom to the top in this order.

Figure 19A:
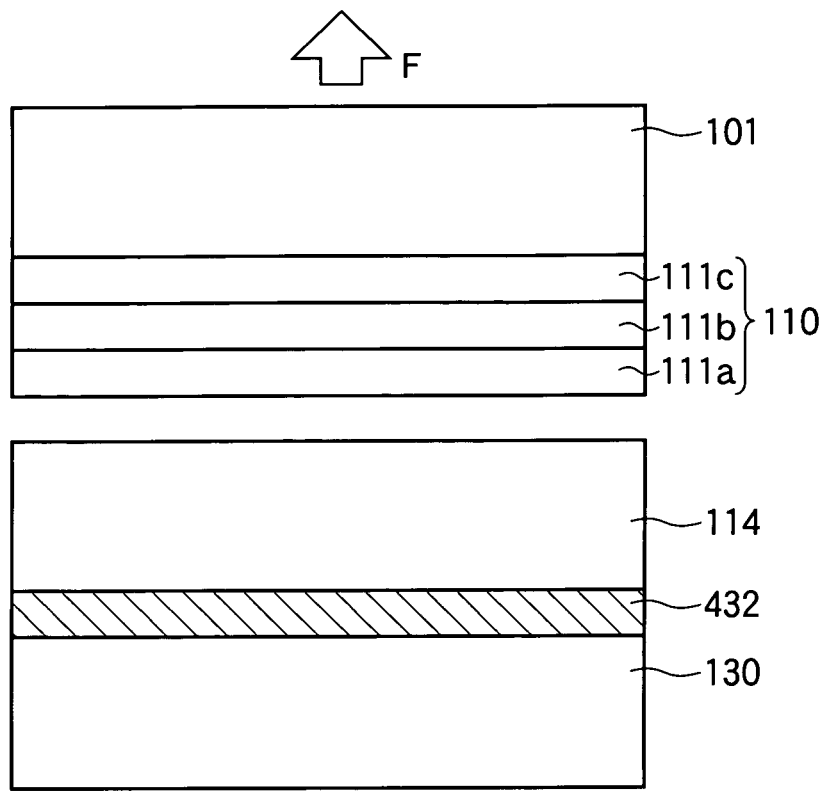
FIGS. 19A and 19B are sectional views respectively showing a process in which SiC substrate is separated from the nitride semiconductor layer, according to the third embodiment of the present invention.

As shown in FIG. 19A, the SiC substrate 101 is pulled away from the second substrate 130 with the force F greater than the intermolecular force between the graphene layers 111a and 111b or greater the intermolecular force between the graphene layer 111a and the nitride semiconductor layer 114, so as to separate the SiC substrate 101 from the second substrate 130. In this regard, the force F is smaller than the joint force between the SiC substrate 101 and the graphene layer 111c.

Figure 19B:
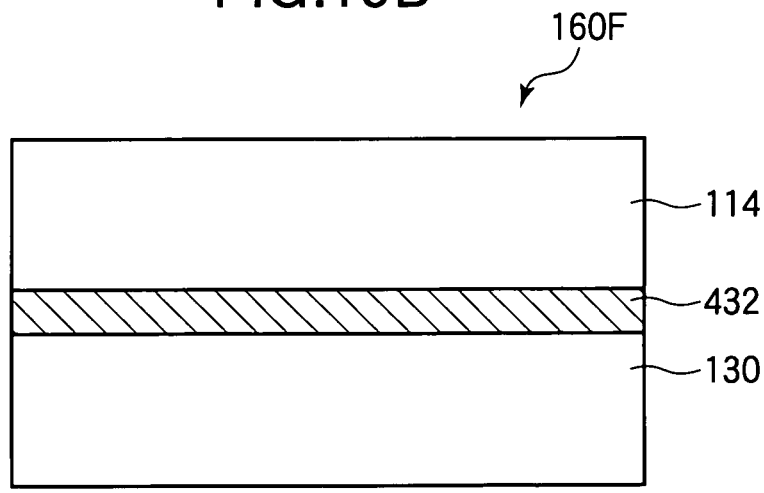

FIG. 19B shows a state after the SiC substrate 101 is separated from the second substrate 130, so that a nitride semiconductor substrate 160F is formed.

The nitride semiconductor substrate 160F includes the second substrate 130, the joining layer 432 and the nitride semiconductor layer 114 which are layered from the bottom to the top in this order. The nitride semiconductor layer 114 can be divided into a plurality of regions as described in the second embodiment. The nitride semiconductor layer 114 can be configured as light emitting elements or electron elements.

According to the third embodiment of the present invention, the nitride semiconductor layer 114 is formed on the surface of the epitaxial graphene layer 110 having been grown on the SiC substrate 101 so as to form the nitride-semiconductor-layer/graphene-layer grown substrate 400, and the surface of the nitride semiconductor layer 114 opposite to the graphene layer 111a is joined to the second substrate 130 (or the joint surface 432 formed on the second substrate 130). Thereafter, the SiC substrate 101 is separated from the nitride semiconductor layer 114. Accordingly, in addition to the advantageous of the first and second embodiments, a process for forming the supporting body (for supporting the nitride semiconductor layer during the separation process) can be omitted.

Fourth Embodiment

Next, a manufacturing method of a graphene substrate 100 and a single crystal nitride semiconductor wafer 300 using the graphene substrate 100 according to the fourth embodiment will be described with reference to FIGS. 20A through 22.

Figure 21:
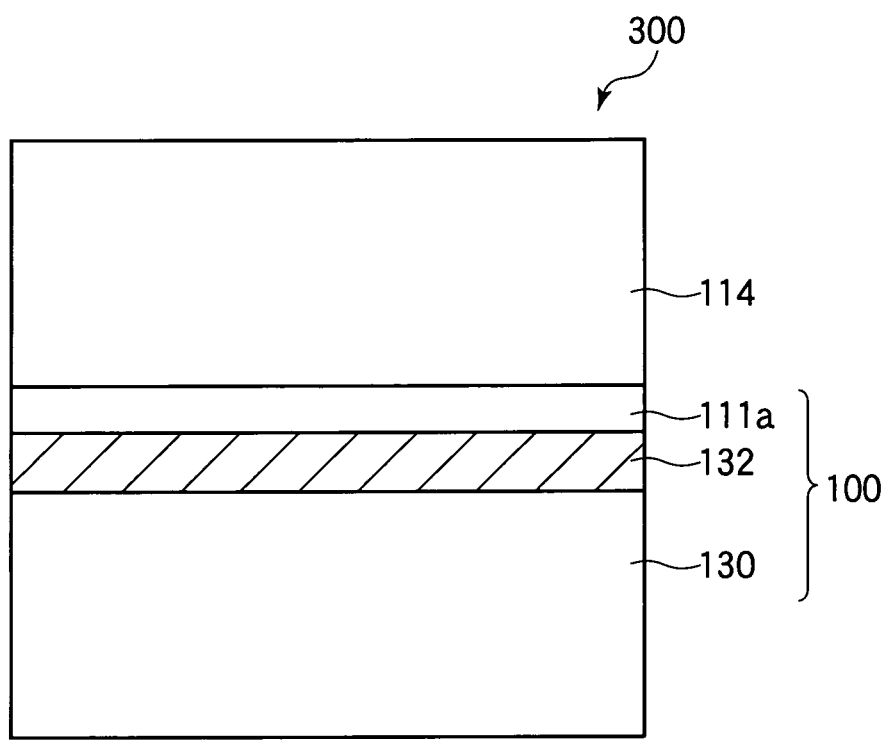
FIG. 21 is a sectional view showing a single crystal nitride semiconductor wafer according to the third embodiment of the present invention.
Figure 22:
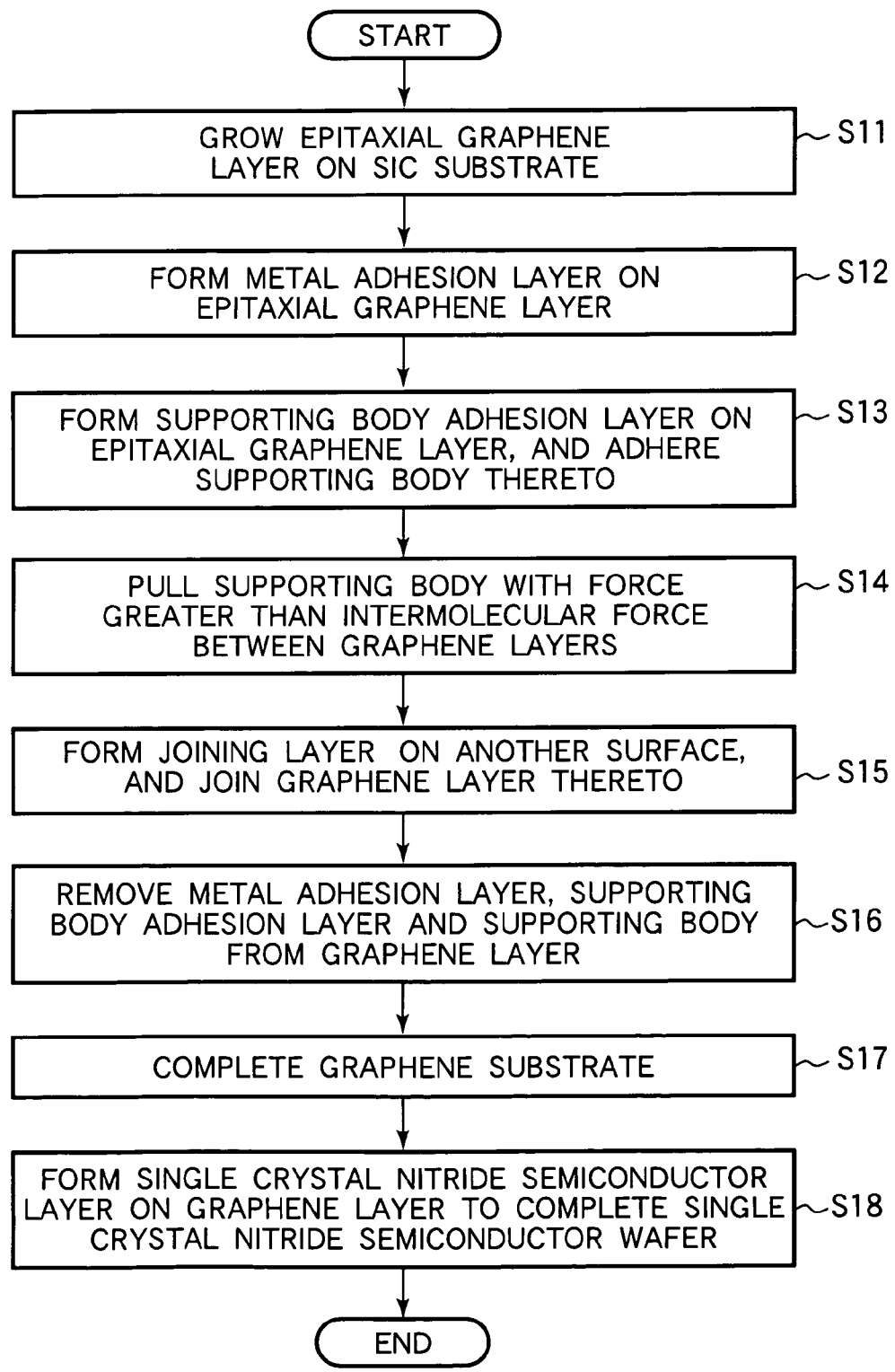
FIG. 22 is a flow chart showing a manufacturing process of the single crystal nitride semiconductor wafer according to the third embodiment of the present invention.

FIGS. 20A through 20E are schematic views for illustrating the manufacturing method of the graphene substrate 100 according to the fourth embodiment. FIG. 21 shows the single crystal nitride semiconductor wafer 300 in which the nitrides semiconductor layer 114 is formed on the surface of the graphene substrate 100. FIG. 22 is a flow chart showing a manufacturing process of the single crystal nitride semiconductor wafer 300 using the graphene substrate 100.

First, the epitaxial graphene layer 110 (including the graphene layers 111a, 111b and 111c) is formed on the surface of the SiC substrate 101, so as to form a graphene-layer-grown substrate 200 (step S11). Then, as shown in FIG. 20A, a metal adhesion layer 120 is formed on the surface of the epitaxial graphene layer 110 on the SiC substrate 101 (step S12). The metal adhesion layer 120 is composed of material that tends to diffuse into the inside of the epitaxial graphene layer 110 from the surface of the epitaxial graphene layer 110. The metal adhesion layer 120 is used for separating the graphene layer 111a from the other graphene layers 111b and 111c as described later. The metal adhesion layer 120 is composed of, for example, a titan (Ti) layer, and is formed on the entire surface of a wafer (i.e., on the epitaxial graphene layer 110 on the SiC substrate 101) by vacuum deposition. Titan (Ti) of the metal adhesion layer (i.e., the Ti layer) 120 is diffused into the graphene layer 111a, with the result that the metal adhesion layer 120 and the graphene layer 111a are strongly joined to each other due to adhering effect such as anchoring effect. In other words, the metal adhesion layer 120 and the graphene layer 111a are joined to each other with a stronger force than the intermolecular force between the graphene layers 111a, 111b and 111c.

Then, as shown in FIG. 20B, the supporting body adhesion layer 122 is formed on the surface of the metal adhesion layer 120 (step S13). The supporting body adhesion layer 122 exhibits high adhesion with the metal adhesion layer 120. Further, the supporting body 124 is adhered to the surface of the supporting body adhesion layer 122. The supporting body 124 is provided for supporting the graphene layer 111a when the graphene layer 111a is separated from the other graphene layers 111b and 111c as described later.

Then, as shown in FIG. 20C, the supporting body 124 is pulled away from the SiC substrate 101 with a force F greater than the intermolecular force between the graphene layers 111a, 111b and 111c, so as to separate the graphene layer 111a from the graphene layer 111b (step S14). Although the metal adhesion layer 120 and the graphene layer 111a are separated from the SiC substrate 101 in FIG. 20C, it is also possible that the metal adhesion layer 120 and a plurality of graphene layers (for example, the graphene layers 111a and 111b) are separated from the SiC substrate 101.

As described in the first embodiment, the SiC substrate 101 has a crystal structure of tetrahedron. If the layers of SiC are stacked so that two layers form a stacking period, the SiC substrate 101 has a hexagonal symmetry. Therefore, the SiC substrate 101 is similar to the graphene layer 111c in having the hexagonal symmetry. However, the SiC substrate 101 does not have a hexagonal symmetry at a joint surface (i.e., a single layer). Therefore, the SiC substrate 101 and the graphene layer 111c are covalently bonded to each other. In other words, the SiC substrate 101 and the graphene layer 111c are not only bonded to each other by a weak force due to regularity of potential, but also bonded to each other by a strong force via bonds. To be more specific, the bonding between the respective graphene layers 111a, 111b and 111c is relatively weak. In contrast, the bonding between the SiC substrate 101 and the graphene layer 111c is strong.

Then, as shown in FIG. 20D, the joining layer 132 is formed on the surface of another substrate, i.e., the second substrate 130 (step S14). Thereafter, the graphene layer 111a is brought into direct contact with the surface of the joining layer 132, so that the graphene layer 111a is fixed to the surface of the joining layer 132 (step S15). The surface of the joining layer 132 and the surface of the graphene layer 111a are joined to each other by the intermolecular force. The joining layer 132 provides excellent joint with the second substrate 130 and the graphene layer 111a. In this regard, "excellent joint" means that a joint strength is uniform throughout joint surfaces, void does not generated at the joint interfaces, and no crack occurs at the joint surfaces. The second substrate 130 is, for example, a Si substrate. The joining layer 132 is, for example, a $SiO_2$ layer.

Then, as shown in FIG. 20E, the metal adhesion layer 120, the supporting body adhesion layer 122 and the supporting body 124 are removed from the surface of the graphene layer 111a (step S16). To be more specific, the metal adhesion layer 120 is removed by chemical etching using acid such as hydrofluoric acid, with the result that the metal adhesion layer 120, the supporting body adhesion layer 122 and the supporting body 124 are removed. With such a process, the graphene substrate 100 in which the graphene layer 111a is formed on the second substrate 130 is obtained (step S17).

Then, as shown in FIG. 21, the single crystal semiconductor layer 114 is grown on the surface of the graphene substrate 100, so as to form a single crystal nitride semiconductor wafer 300 (step S18). The joining layer 132 formed on the second surface 130 and the graphene layer 111a are jointed to each other by intermolecular force, and the graphene layer 111a and the nitrides semiconductor layer 114 are joined to each other by intermolecular force.

Since the nitride semiconductor layer 114 and the graphene layer 111a are bonded to each other by intermolecular force, it is preferred that the surface of the graphene layer 111a has a flatness on the order of nanometers. In this regard, "the flatness on the order of nanometers" means that the surface roughness (to be more specific, the maximum valley depth Rrv, i.e., the maximum peak-to-valley difference) measured using the atomic force microscope (AFM) is smaller than 10 nm. It is more preferred that the surface roughness Rrv of the joining layer 132 formed on the second substrate 130 is smaller than or equal to 3 nm.

The second substrate 130 is preferably, for example, a Si substrate, a ceramic substrate such as AlN substrate, a glass substrate, a quartz substrate, a plastic substrate or a metal substrate. The joining layer 132 formed on the second substrate 130 is preferably composed of material selected among, for example, $SiO_2$, SiN, SiON, PSG, BSG, SOG, metal and organic substance. The joining layer 132 is formed using, for example, plasma CVD method, CVD method or sputtering method.

In this regard, it is also possible that the joining layer 132 and the graphene layer 111a (or the graphene layer 111a and the nitride semiconductor layer 114) are joined to each other by means of atomic diffusion or compound formation via the interface, instead of intermolecular force.

Hereinafter, the crystal growth of a gallium nitride (GaN) thin film will be described. The graphene substrate 100 is placed into the crystal growth apparatus such as an MBE apparatus or MOCVD apparatus. The graphene substrate 100 is heated in the crystal growth apparatus, and gallium (Ga) and activated nitrogen are supplied into the crystal growth apparatus. The activated nitrogen is supplied by an electron cyclotron resonance (ECR) or a high-frequency excited radical source.

The nitride semiconductor layer 114 (particularly, GaN) has a crystal structure of hexagonal column. On each end surface of the hexagonal column, nitrogen (N) atoms are bonded to each other two-dimensionally in a hexagonal shape. In the graphene layer 111a, carbon (C) atoms are bonded to each other two-dimensionally in a hexagonal shape (see FIG. 1B). Nitrogen atoms (arranged in a hexagon) are disposed in between carbon atoms. Therefore, the nitride semiconductor layer 114 and the graphene layer 111a are not covalently bonded to each other, but are physically bonded to each other due to regularity of potential at the surfaces (i.e., regularity of potential at atomic level at the interface therebetween). Gallium (Ga) is not covalently bonded to the graphene layer 111a, and therefore crystal defects due to lattice mismatch does not occur. By growing second and third GaN layers (and succeeding GaN layers if needed) on the first GaN layer, a single crystal GaN layer with a predetermined number of layers is formed.

Since no crystal defects (due to lattice mismatch) occurs in the first layer of GaN, the resultant GaN layer has remarkably few crystal defects, i.e., a high quality single crystal semiconductor layer is obtained. With such a process, it becomes possible to obtain, for example, a semiconductor wafer in which a high quality single crystal nitride gallium (GaN) layer with substantially no crystal defects is formed on a surface of a large diameter Si substrate.

According to the fourth embodiment of the present invention, the single crystal nitride semiconductor layer 114 is grown on the surface of the graphene substrate 100 in which the graphene layer 111a is joined to the surface of the second substrate 130 by means of intermolecular force. This provides the following advantages:

The nitride semiconductor layer 114 is grown on the graphene layer 111a due to regularity of specific potential at the surfaces of the graphene layer 111a and the nitride semiconductor layer 114. Since no covalent bonding is involved, crystal defects (due to lattice mismatch) can be prevented.

A low-cost, large-diameter Si substrate can be used as the second substrate 130, and therefore a low-cost, large-diameter single crystal nitride semiconductor layer growth wafer can be obtained.

The second substrate 130 can be selected among various options, and therefore optimum substrate best suited for application can be selected.

Modification.

In the above described fourth embodiment, description has been made of an example where the nitride gallium (GaN) layer is formed on the surface of the graphene layer 111a. However, the fourth embodiment can be applied to crystal growth of other nitride semiconductor layer 114, for example, $Al_xGa_{1-x}N$ ($1 \geq x \geq 0$), $In_xGa_{1-x}N$ ($1 \geq x \geq 0$) and $Al_xIn_{1-x}N$ ($1 \geq x \geq 0$).

Further, in the fourth embodiment, the nitride semiconductor layer 114 is grown on the graphene layer 111a due to regularity of specific potential at the surfaces of the graphene layer 111a and the nitride semiconductor layer 114, without utilizing covalent bonding. Therefore, the fourth embodiment can be applied to crystal growth of other semiconductor layer (i.e., other than the nitride semiconductor layer) such as III-V group compound semiconductor layer, II-VI group compound semiconductor layer or IV-IV group compound semiconductor layer.

Fifth Embodiment

The fifth embodiment of the present invention is different from the fourth embodiment in that the single crystal nitride semiconductor layer is grown on the substrate on which the epitaxial graphene layer has been formed.

The fifth embodiment will be described with reference to FIGS. 23A and 23B.

Figure 23A:
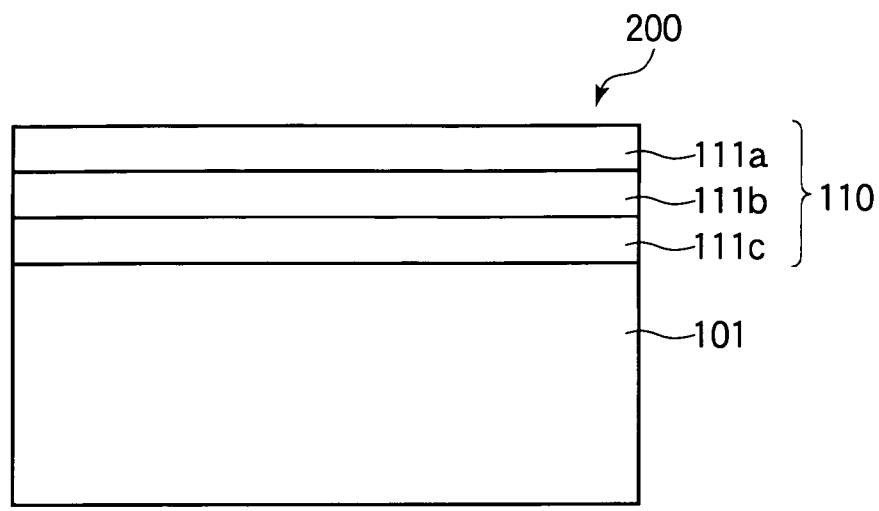
FIG. 23A is a sectional view showing a graphene-layer grown substrate according to the fifth embodiment of the present invention.

FIG. 23A shows the graphene-layer-grown substrate 200. As shown in FIG. 23A, the epitaxial graphene layer 110 is formed on the surface of the SiC substrate 101 using the method having been described in the fourth embodiment, so as to form the graphene-layer-grown substrate 200. Here, the epitaxial graphene layer 110 includes three graphene layers 111a, 111b and 111c.

Then, the graphene-layer-grown substrate 200 is placed in the crystal growth apparatus, and gallium nitride (GaN) is formed on the surface of the graphene-layer-grown substrate 200 using the MBE method or MOCVD method. By introducing gallium (Ga) and activated nitrogen into the crystal growth apparatus, gallium (Ga) is adsorbed onto a center portion of the honeycomb structure of carbon atoms of the graphene layer 111a, so that a first layer having six-fold symmetry is formed. Further, activated nitrogen is adsorbed onto the first layer of gallium (Ga), so that a first layer of hexagonal GaN (h-GaN) is formed. The activated nitrogen is supplied by an electron cyclotron resonance (ECR) or a high-frequency excited radical source.

By growing second and third GaN layers (and succeeding GaN layers if needed) on the first GaN layer, a single crystal GaN layer with a predetermined number of layers is formed.

Figure 23B:
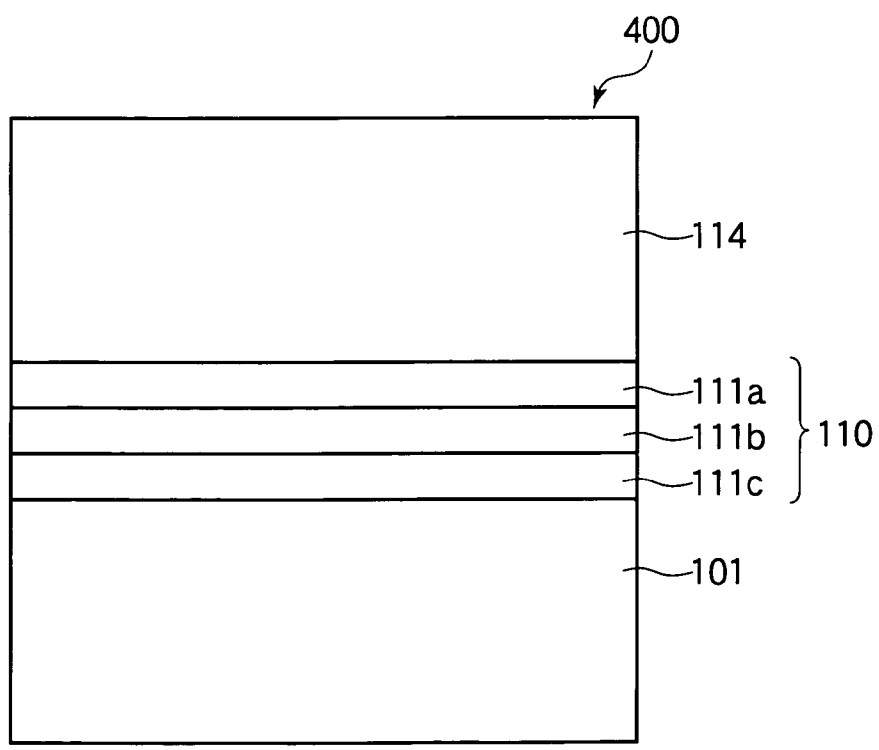
FIG. 23B is a sectional view showing a single crystal semiconductor wafer according to the fifth embodiment of the present invention.

FIG. 23B shows a semiconductor wafer 400 in which the nitride semiconductor layer 114 is formed on the surface of the graphene-layer-grown substrate 200. The nitrides semiconductor layer 114 is composed of a semiconductor material selected among, for example, $Al_xGa_{1-x}N$ ($1 \geq x \geq 0$), $Al_xIn_{1-x}N$ ($1 \geq x \geq 0$) and $In_xGa_{1-x}N$ either alone or in combination. Further, the nitrides semiconductor layer 114 can be composed of a compound semiconductor material that contains nitrogen.

In the fifth embodiment of the present invention, although the usable substrate is limited as compared with the fourth embodiment, the single crystal semiconductor wafer 400 can be manufactured without a transferring (i.e., separating and joining) process of the graphene layer 111a. Therefore, even if lattice mismatch exists, a high quality single crystal semiconductor layer (in which the epitaxial graphene layer 110 is joined to the SiC substrate 101 by intermolecular force) with substantially no crystal defects can be manufactured.

Modification.

In the above described fifth embodiment, the SiC substrate 101 has been used. However, it is also possible to use a Si substrate instead of the SiC substrate 101, to form the epitaxial graphene layer 110 on the surface of the Si substrate, and to perform the crystal growth of the above described semiconductor layer thereon.

While the preferred embodiments of the present invention have been illustrated in detail, it should be apparent that modifications and improvements may be made to the invention without departing from the spirit and scope of the invention as described in the following claims.

What is claimed is:

1. A separation method of a nitride semiconductor layer, said separation method comprising the steps of:
    growing a graphene layer in the form of a single layer or two or more layers on a surface of a first substrate;
    forming a nitride semiconductor layer on said graphene layer so that said nitride semiconductor layer is bonded to said graphene layer with a bonding force due to regularity of potential at atomic level at an interface therebetween without utilizing covalent bonding; and
    separating said nitride semiconductor layer from said first substrate with a force which is greater than said bonding force between said nitride semiconductor layer and said graphene layer, or greater than a bonding force between layers of said graphene layer.

2. A manufacturing method of a nitride semiconductor device, said manufacturing method comprising said separation method of said nitride semiconductor layer according to claim 1,
    said manufacturing method further comprising the step of:
    joining said nitride semiconductor layer to a surface of a second substrate.

3. The manufacturing method according to claim 2, wherein said first substrate is a SiC substrate, and
    wherein said nitride semiconductor layer includes a plurality of layers including a layer joined to said graphene layer, and said layer joined to said graphene layer is composed of a nitride layer.

4. The manufacturing method according to claim 2, further comprising the step of:
    dividing said nitride semiconductor layer into a plurality of regions.

5. The manufacturing method according to claim 2, wherein said nitride semiconductor layer has a part or whole body of a light emitting element or electron element.

6. A manufacturing method of a semiconductor device, said manufacturing method comprising the steps of:
    growing a graphene layer in the form of a single layer or two or more layers on a surface of a first substrate;
    forming a nitride semiconductor layer on said graphene layer so that said nitride semiconductor layer is bonded to said graphene layer with a bonding force due to regularity of potential at atomic level at an interface therebetween without utilizing covalent bonding;
    separating said nitride semiconductor layer from said first substrate with a force which is greater than said bonding force between said nitride semiconductor layer and said graphene layer; and
    joining said separated nitride semiconductor layer to a surface of a second substrate.

7. The manufacturing method according to claim 6, further comprising the step of:
    dividing said nitride semiconductor layer into a plurality of regions.

8. The manufacturing method according to claim 6, wherein said nitride semiconductor layer has a part or whole body of a light emitting element or electron element.

9. A manufacturing method of a semiconductor wafer, said manufacturing method comprising the steps of:
    providing a graphene layer on a surface of a first substrate;
    forming a lowermost layer of a single crystal semiconductor layer that includes a plurality of layers on said graphene layer in such a manner that one constituent element of a crystal of said single crystal semiconductor layer is adsorbed to a center portion of a honeycomb structure of carbon atoms of said graphene layer, and the other constituent element of said crystal is bonded to said one constituent element; and growing other layers of said single crystal semiconductor layer on a surface of said lowermost layer.

10. The manufacturing method according to claim 9, further comprising the steps of:

separating said graphene layer from a second substrate; and joining said separated graphene layer to said surface of said first substrate by intermolecular force.

11. The manufacturing method according to claim 9, wherein said single crystal semiconductor layer is composed of a nitride semiconductor layer containing at least one element selected among In, Ga and Al.

12. A semiconductor wafer comprising:

a first substrate;

a graphene layer separated from a second substrate different from said first substrate, said graphene layer being bonded to a surface of said first substrate; and a single crystal semiconductor layer grown on a surface of said graphene layer;

wherein said single crystal semiconductor layer is formed in such a manner that one constituent element of a crystal of said single crystal semiconductor layer is adsorbed to a center portion of a honeycomb structure of carbon atoms of said graphene layer, and the other constituent element of said crystal is bonded to said one constituent element.

13. The semiconductor wafer according to claim 12, wherein said graphene layer is bonded to a surface of said first substrate by intermolecular force.

14. The semiconductor wafer according to claim 12, wherein said single crystal semiconductor layer is composed of a nitride semiconductor layer containing at least one element selected among In, Ga and Al.

* * * * *